(12) United States Patent
Sato et al.

(10) Patent No.: US 7,002,665 B2
(45) Date of Patent: Feb. 21, 2006

(54) LITHOGRAPHY SIMULATION METHOD, MASK PATTERN CORRECTION METHOD, AND SUBSTRATE TOPOGRAPHY CORRECTION METHOD

(75) Inventors: Takashi Sato, Fujisawa (JP); Satoshi Tanaka, Kawasaki (JP); Ayako Nakano, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 124 days.

(21) Appl. No.: 10/781,652

(22) Filed: Feb. 20, 2004

(65) Prior Publication Data
US 2004/0227921 A1   Nov. 18, 2004

(30) Foreign Application Priority Data
Feb. 21, 2003 (JP) .......................... P2003-044443

(51) Int. Cl.
*G03B 27/42* (2006.01)
(52) U.S. Cl. ..................... 355/53; 355/69; 355/77; 716/19; 716/21; 382/144; 382/145; 430/5; 430/30; 250/548

(58) Field of Classification Search ............... 355/53, 355/69, 77; 430/5, 30, 311, 322; 356/124, 356/349, 363, 399; 250/492.1, 548, 492.2; 382/144–150; 716/21; 703/2
See application file for complete search history.

(56) References Cited

U.S. PATENT DOCUMENTS

| 6,137,901 | A   |   | 10/2000 | Harazaki | ............ 382/144 |
| 6,335,981 | B1  | * | 1/2002  | Harazaki | ............ 382/144 |
| 6,449,387 | B1  | * | 9/2002  | Inui      | ............ 382/144 |
| 6,792,591 | B1  | * | 9/2004  | Shi et al. | ............ 716/19 |

FOREIGN PATENT DOCUMENTS

| JP | 2002-6475 |   | 1/2002 |
| JP | 2002006475 | * | 1/2002 |

* cited by examiner

*Primary Examiner*—D. Rutledge
(74) *Attorney, Agent, or Firm*—Finnegan, Henderson, Farabow, Garrett & Dunner, L.L.P.

(57) ABSTRACT

An aspect of the present invention provides simulation that includes dividing a surface of a substrate onto which light that is focused at an aperture angle by a projection lens is shone into a first region onto which all of the light strikes and a second region onto which a portion of the light strikes, calculating an intensity of the light shone onto the first region, and calculating an intensity of the light shone onto the second region.

18 Claims, 17 Drawing Sheets

LITHOGRAPHY SIMULATION METHOD, MASK PATTERN CORRECTION METHOD, AND SUBSTRATE TOPOGRAPHY CORRECTION METHOD

CROSS REFERENCE TO RELATED APPLICATIONS

This application is based upon and claims the benefit of priority from the prior Japanese Patent Application No. P2003-044443 filed on Feb. 21, 2003, the entire contents of which are incorporated herein by reference.

BACKGROUND OF THE INVENTION

1. Field of the Invention

The present invention relates to a lithography simulation method, a mask pattern correction method, and a processed substrate topography correction method, more particularly, to a lithographic simulation technology for finding the distribution of light intensity on the surface of a substrate.

2. Description of Related Art

During lithographic processing of a semiconductor device, a portion of the light shone onto the surface of the substrate is sometimes blocked due to uneven portion such as step-like parts or other irregularities on the surface of the substrate. Conventional lithography simulations calculate the distribution of light intensity at the surface of the substrate using simple methods that assume the incident light and exiting light are normal to the surface of the substrate (Japanese Laid-Open Patent Publication No. 2002-6475), or using rigorous methods in which the light intensity distribution at the step-like part is calculated by solving Maxwell's equations.

The rigorous method is not preferred from a practical standpoint because the calculations require an enormous amount of time. Meanwhile, although the aforementioned simple method is able to achieve some degree of calculation precision when the shape of the step-like part is somewhat gentle, it has poor precision when there are more severe irregularities on the substrate. The poor calculation precision is thought to be caused by the fact that the orientation of light reflecting from step-like parts deviates from the normal direction, and it has been believed that the only way to improve the calculation precision is to use the aforementioned rigorous method.

SUMMARY OF THE INVENTION

An aspect of the present invention provides simulation that includes dividing a surface of a substrate onto which light that is focused at an aperture angle by a projection lens is shone into a first region onto which all of the light strikes and a second region onto which a portion of the light strikes, calculating an intensity of the light shone onto the first region, and calculating an intensity of the light shone onto the second region.

Another aspect of the present invention provides a method of mask pattern correction that includes dividing a surface of a substrate onto which light that is focused at an aperture angle by a projection lens is shone into a first region onto which all of the light strikes and a second region onto which a portion of the light strikes, calculating an intensity of the light shone onto the first region, calculating an intensity of the light shone onto the second region, calculating an exposure pattern to be transferred to the substrate using a mask pattern based on the intensities of the light shone onto the first and second regions, and, correcting the shape of mask pattern in such a manner as to reduce the amount of deviation of the exposure pattern from a desired design pattern.

Furthermore, another aspect of the present invention provides a method of mask pattern correction that includes dividing a surface of a substrate onto which light that is focused at an aperture angle by a projection lens is shone into a first region onto which all of the light strikes and a second region onto which a portion of the light strikes, calculating an intensity of the light shone onto the first region, calculating an intensity of the light shone onto the second region, calculating an exposure pattern to be transferred to the substrate based on the intensities of the light shone onto the first and second regions, and, correcting the topology of the substrate in such a manner as to reduce the amount of deviation of the exposure pattern from a desired design pattern.

DETAILED DESCRIPTION OF EMBODIMENTS

Embodiments of the present invention will now be described with reference to the drawings. In descriptions of the drawings, identical or similar parts will be given identical or similar reference symbols. The drawings are merely representative examples and do not limit the invention, particularly regarding such characteristics as the relationship between the thickness and width of individual layers and the ratios of the thicknesses of one layer to another. Furthermore, the invention is not limited by the relationships between and/or the ratios of the dimensions of one drawing and the dimensions of another.

(First Embodiment)

Figure 1:
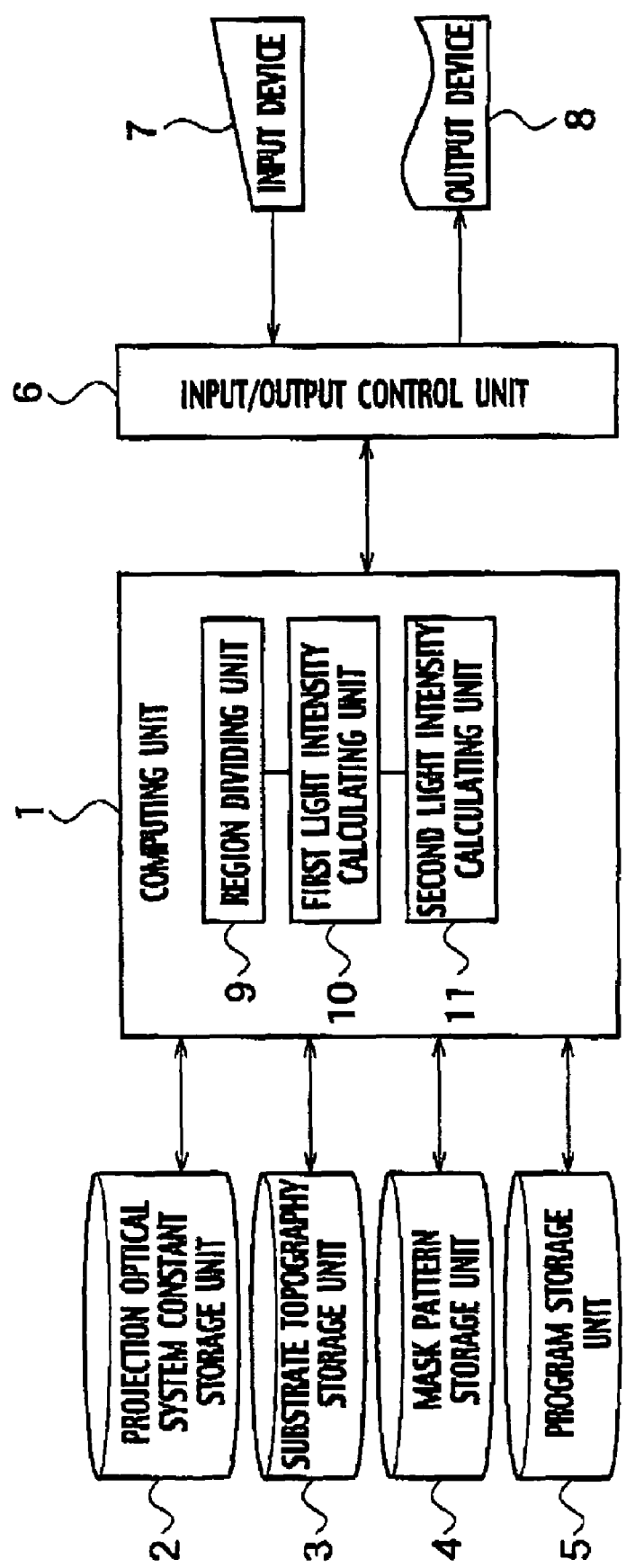
FIG. 1 is a block diagram showing a lithography simulation apparatus for a lithography simulation method according to the first embodiment.

A lithography simulation method in accordance with the first embodiment can be achieved using, for example, the lithography simulation apparatus shown in FIG. 1. This lithography simulation apparatus includes a computing unit 1 having functions for calculating the in-plane intensity distribution of light shone onto the surface of the substrate and at least the following units that are connected to the computing unit 1: a projection optical system constant storage unit 2, a substrate topography storage unit 3, a mask pattern storage unit 4, and a program storage unit 5. The computing unit 1 includes a region dividing unit 9 configured to divide the surface of a substrate—onto which light focused to a prescribed aperture angle by a projection lens is shone—into a first region onto which all of the light is shone and a second region onto which only a portion of the light is shone, a first light intensity calculating unit 10 configured to find the intensity of the light shone onto the first region, and a second light intensity calculating unit 11 configured to find the intensity of the light shone onto the second region.

The projection optical system constant storage unit 2 stores projection optical system constants required for lithography simulations. The projection optical system constants include the pupil function $P(\xi,\eta)$ of the optical system, the aperture function $P_0(\xi, \eta)$ of the optical system, the numerical aperture $NA_p$ of the projection lens, the aperture angle $\alpha$ of the projection lens, the wavefront aberration $W(\xi, \eta)$ of the projection lens, the partial coherence ratio (coherency) $\sigma$ (which indicates the ratio between the numerical aperture of the illumination optical system and the numerical aperture of the projection optical system), the Fourier spectrum a, and the transmission cross-coefficient (TCC) $T(f1, f2; g1, g2)$. The substrate topography storage unit 3 stores data related to the topography of the substrate. The substrate topography includes three-dimensional shape data for the substrate, such as the shape of step-like parts resulting from irregularities in the surface of the substrate. The mask pattern storage unit 4 stores data related the shape of the mask pattern that will be transferred to the surface of the substrate by shining light. The program storage unit 5 stores a computer-readable program for calculating the distribution of the light intensity at the surface of the substrate. The program can be stored in either a read-only format or in a readable/writeable format.

The computing unit 1 forms a portion of a central computing unit (CPU) in a regular computer system. Although omitted from the drawings, the computing unit 1 is connected to a main storage unit configured to temporarily store programs that can be read by a computer for calculating the distribution of the light intensity at the surface of the substrate and data that will be processed by the computing unit 1. For the projection optical system constant storage unit 2, substrate topography storage unit 3, mask pattern storage unit 4, and program storage unit 5, it is acceptable to use a semiconductor memory (e.g., a semiconductor ROM or a semiconductor RAM), a magnetic disk device, a magnetic drum device, a magnetic tape device, or other auxiliary storage device. It is also acceptable to use a portion of the main storage unit inside the CPU. Through an input/output control unit 6, the computing unit 1 is connected to an input device 7 configured to receive data, commands, and other input from an operator and an output device 8 configured to output the distribution of the light intensity at the surface of the substrate. A keyboard, mouse, light pen, or flexible disk device can be used as the input device 7. A display device or printer can be used as the output device 8.

Figure 2:
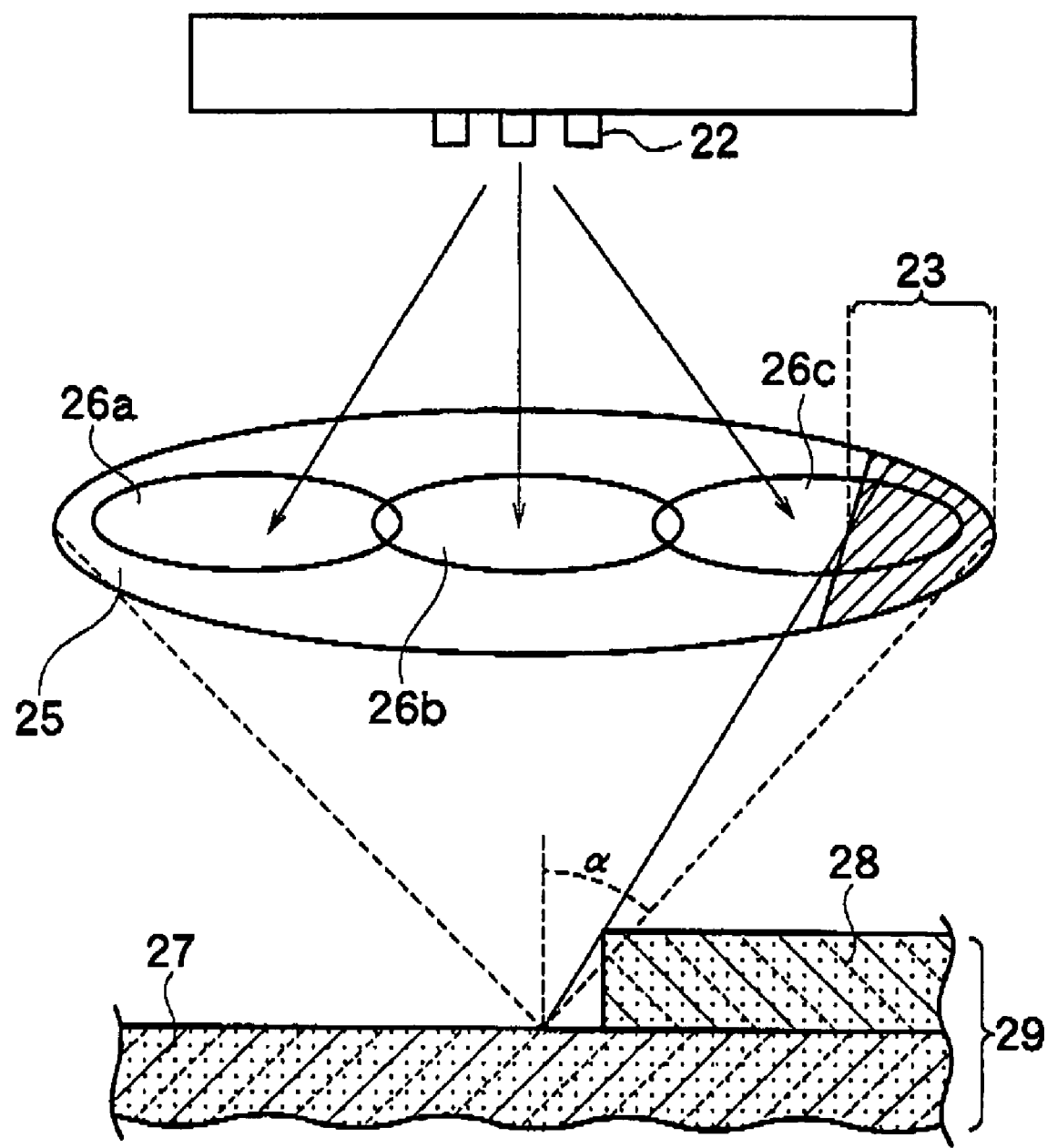
FIG. 2 is a diagrammatic view illustrating the shape of a step-like part of the surface of the substrate and the projection optical system in a case where the mask pattern 22 is not perpendicular to the planar shape of a polysilicon film 28 serving as a base pattern.

FIG. 2 is a diagrammatic view illustrating the shape of a step-like part of the surface of the substrate and the projection optical system in a case where the mask pattern 22 is not perpendicular to the planar shape of a polysilicon film 28 serving as a base pattern. As shown in FIG. 2, the substrate 29 includes, for example, a semiconductor substrate 27 and a polysilicon film 28 deposited onto the surface of the semiconductor substrate 27. The polysilicon film 28 is patterned in a prescribed shape and functions as, for example, the gate electrodes of MOS transistors. Consequently, there are step-like parts between the outside perimeter of the polysilicon film 28 and the semiconductor substrate 27.

Light focused at a prescribed aperture angle $\alpha$ by a projection lens is shone onto the surface of the substrate 29. When a step-like part exists on the surface of the substrate, the light will shine onto the polysilicon film 28 (which is positioned at the top of the step-like part) and a shadow will be cast on the semiconductor substrate 27 (which is positioned at the bottom of the step-like part). That is, a portion of the light focused at the aperture angle $\alpha$ is eclipsed by the polysilicon film 28 at the step-like part. In other words, only a portion of the exit pupil 25 of the projection lens can be seen from the surface of the semiconductor substrate 27 in the vicinity of the step-like part and the remainder of the exit pupil 25 is eclipsed. This eclipsed portion is called the "eclipsed portion" 23. The eclipsed portion 23 of the exit pupil 25 does not contribute to the image of the mask pattern 22. The amount of light that is eclipsed depends on the height of the step-like part and the distance from a vertical line dropped from the apex of the step-like part. Meanwhile, all of the light shines on the surface of the polysilicon film 28 and on portions of the surface of the semiconductor substrate 27 that are distant from the step-like part. Thus, the intensity of the light striking the surface of the substrate 29 varies depending on the whether or not the light is eclipsed and the degree of the eclipsing when eclipsing occurs. The surface of the substrate 29 includes the surface of the exposed semiconductor substrate 27 and the surface of the polysilicon film 28. The region dividing unit 9 divides the surface of the substrate 29 into a region (first region) onto which all of the light strikes and a region (second region) on which only a portion of the light strikes and the remainder is eclipsed.

When the mask pattern 22 is not perpendicular to the planar shape of the polysilicon film 28 (base pattern), the eclipsed portion 23 of the exit pupil 25 overlaps to different degrees with a plurality of diffracted lights generated by the mask pattern 22. As shown in FIG. 2, when the mask pattern 22 is arranged parallel to the planar shape of the polysilicon film 28 (base pattern), the 0-order light 26b and the +1-order light 26a of the mask pattern 22 do not overlap with the eclipsed portion 23 but the −1-order light 26c does overlap with the eclipsed portion 23. The eclipsed portion 23 of the exit pupil 25 does not contribute to the image of the mask pattern 22. Therefore, the intensity of the light should be found based on the shape of the exit pupil 25.

Figure 3:
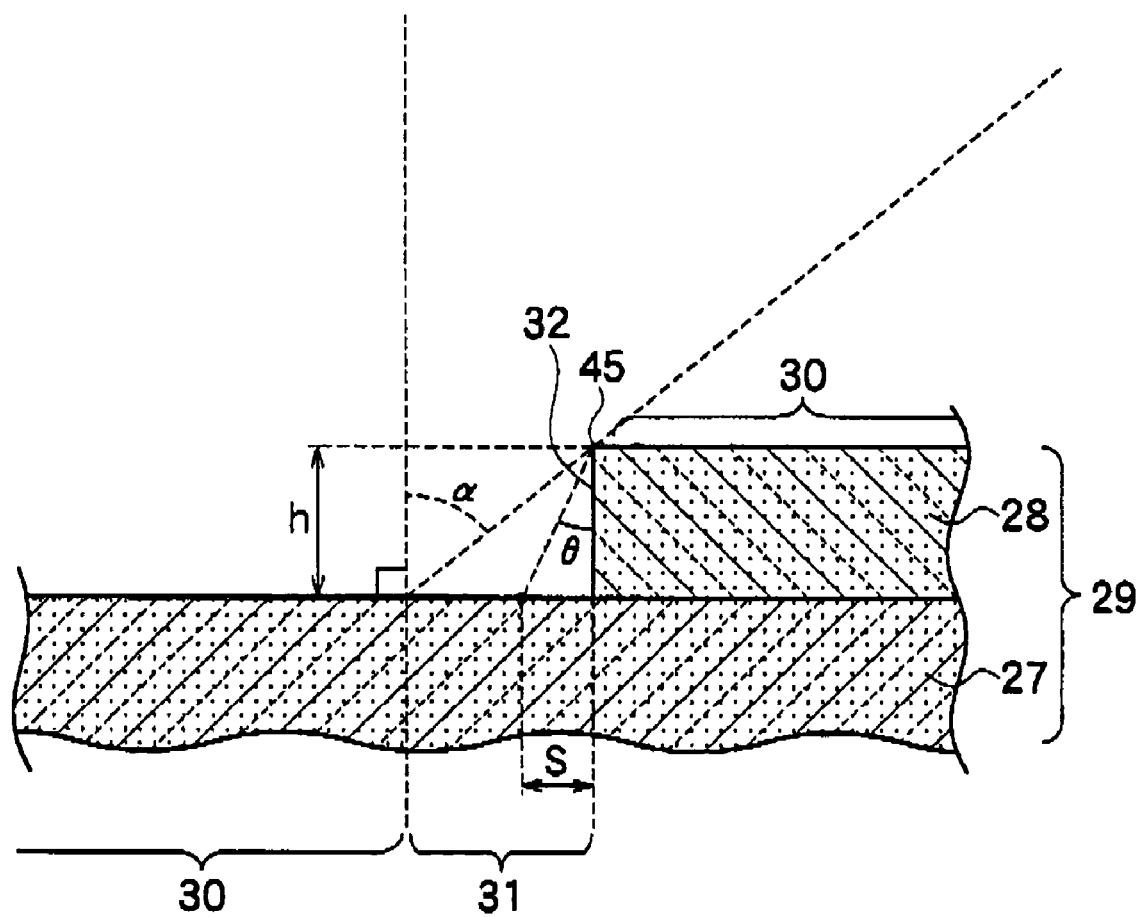
FIG. 3 is an enlarged cross sectional view of the step-like part of the substrate 29 shown in FIG. 2.

FIG. 3 is an enlarged cross sectional view of the step-like part of the substrate 29 shown in FIG. 2. The region dividing unit 9 of FIG. 1 divides the surface of the substrate 29 into a first region 30 and a second region 31 as follows. As shown in FIG. 3, the light is focused onto the surface of the substrate 29 with an aperture angle $\alpha$. The height of the step-like part, i.e., the thickness of the polysilicon film 28, is indicated as "h." Consider a case in which the exit pupil 25 is viewed from a point located at a distance s from a vertical line dropped from the apex 45 of the step-like part. The angle $\theta$ formed between a line connecting the apex 45 of the step-like part and the point at distance s and a vertical line dropped from the apex 45 of the step-like part is defined by Equation (1). Since the slope angle of the step-like part is vertical, this explanation will concern a point located at a distance s from the lateral face 32 of the step-like part.

$$\tan \theta = s/h \quad (1)$$

When $\theta$ is larger than $\alpha$, there is no eclipsing of the exit pupil 25 at the point located at a distance s from the lateral face 32. In other words, the first region 30 is formed by points that satisfy the condition $\theta > \alpha$. Conversely, when $\theta$ is equal to or smaller than $\alpha$, eclipsing of the exit pupil 25 occurs at the point located at a distance s from the lateral face 32. In other words, the second region 31 is formed by points that satisfy the condition $\theta \leq \alpha$. The top surface of the polysilicon film 28 is included in the first region 30 because there are no step-like parts to block the light. The region dividing unit 9 determines the first and second regions 30, 31 based on the projection optical system constants stored in the projection optical system constant storage unit 2 and the substrate topography stored in the substrate topography storage unit 3. The projection optical system constants include the numerical aperture $NA_p$ of the lens, the aperture angle $\alpha$, and the partial coherence ratio $\sigma$. The topography of the substrate includes the height h of the step-like part and the slope angle of the lateral face 32.

The first light intensity calculating unit 10 and second light intensity calculating unit 11 of FIG. 1 calculate the intensity of the light shone onto the first region 30 and the second region 31. The wavefront aberration is expressed as $W(\xi, \eta)$ using the coordinates $(\xi, \eta)$ of the exit pupil 25 of the projection lens. The pupil function $P(\xi, \eta)$ of the optical system is expressed according to Equation (2). The pupil function $P(\xi, \eta)$ is set in consideration of the resolution of the light and is 0 in the eclipsed portion 23 of the exit pupil 25. In Equation (2), $P_0(\xi, \eta)$ is the aperture function and is defined to have a value of 1 inside the exit pupil 25 and a value of 0 outside the exit pupil 25. The item k is the wave number and is given by $k=2\pi/\lambda$, where $\lambda$ is the wavelength.

$$P(\xi,\eta)=P_0(\xi,\eta)\exp(ikW(\xi,\eta)) \quad (2)$$

When an optical system forms the image of a transilluminated object, the intensity distribution I(x, y) of the image is expressed according to Equation (3).

$$I_0(x, y) = \int_\infty^\infty \int \int \int T(f_1, f_2; g_1, g_2) a(f_1, g_1) a^*(f_2, g_2) \quad (3)$$
$$\exp[i(f_1 - f_2)x + i(g_1 - g_2)y] df_1 df_2 dg_1 dg_2.$$

In Equation (3), a is the Fourier spectrum of the object and a* is the complex conjugate of a. T(f1, f2; g1, g2) expresses the frequency response of the optical system and is called the transmission cross-coefficient (TCC). It is expressed according to Equation (4).

$$T(\xi_1, \xi_2; \eta_1, \eta_2) = \quad (4)$$
$$\int_{-\infty}^{\infty} \int S(\xi, \eta) P(\xi - \xi_1, \eta - \eta_1) \times P^*(\xi - \xi_2, \eta - \eta_2) d\xi d\eta$$

In Equation (4), $P_0$ ($\xi$, $\eta$) is the aperture function and S($\xi$, $\eta$) is a function expressing the effective light source over the pupil. Assuming the brightness distribution of the effective light source is uniform, S($\xi$, $\eta$) has the value of 1 inside a circle of radius $\sigma$ and 0 outside said circle. $\sigma$ is the partial coherence ratio. This completes a general description how imaging of the light is handled. The description is disclosed, for example, page 279 of *Applied Optics* 1 (published by Baifukan, 1990) by Tadao Tsuruta.

The second light intensity calculating unit 11 of FIG. 1 finds the intensity of the light shone onto the second region 31, where the exit pupil 25 is eclipsed. The second region 31 is shaded when viewed from the exit pupil 25 and the intensity of the light shone thereon depends on the height h of the step-like part and the distance s from a vertical line dropped from the apex 45 of the step-like part.

Figure 4:
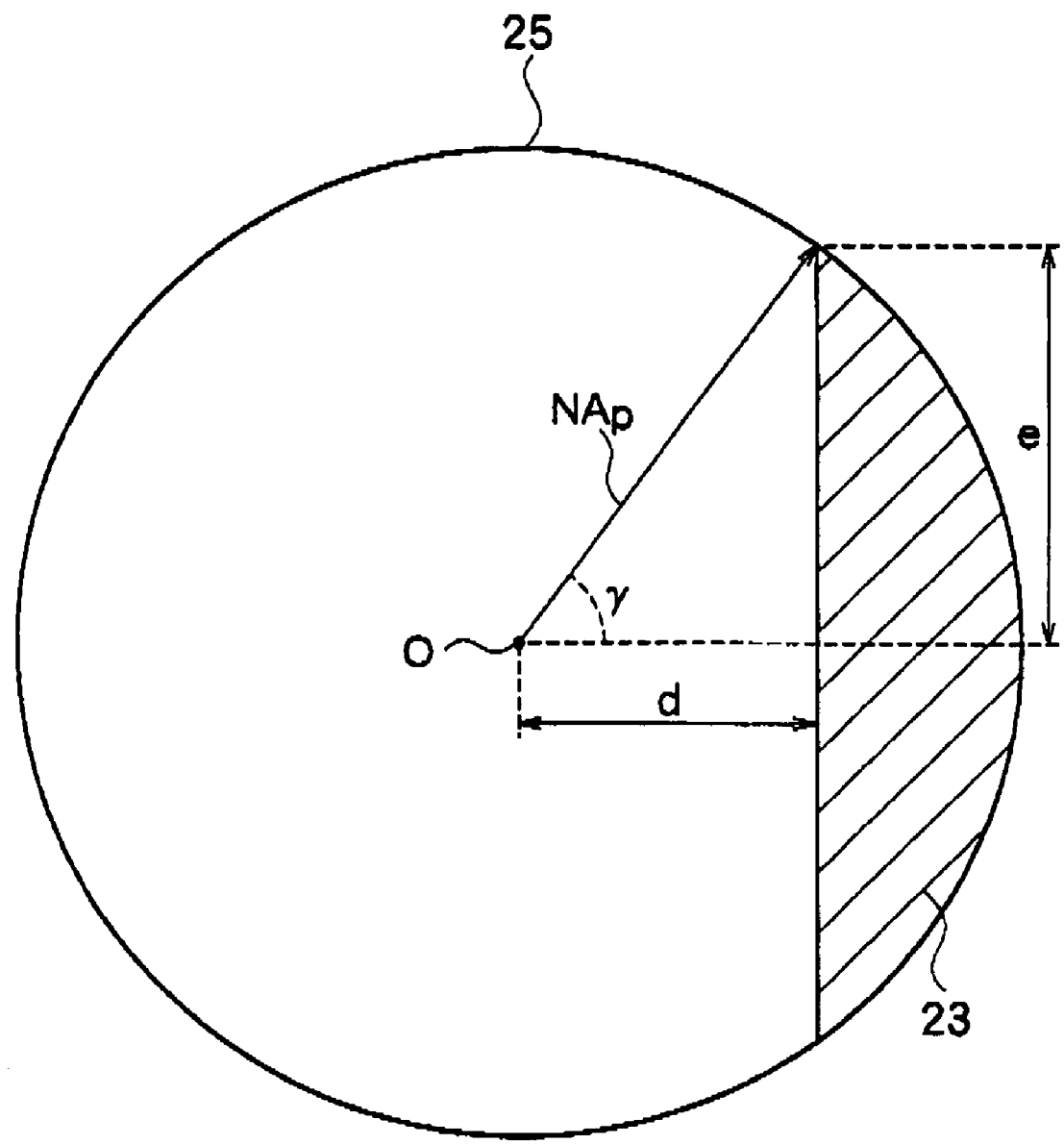
FIG. 4 is a plan view showing the shape of the pupil 25 and the eclipsed portion 23.

The FIG. 4 is a plan view showing the shape of the pupil 25 and the eclipsed portion 23. When the exit pupil 25 is viewed from a point located at a distance s from a vertical line dropped from the apex 45 of the step-like part as shown in FIG. 3, the light is blocked by the step-like part at the eclipsed portion 23 of the exit pupil 25, which is defined by a circle of radius $NA_p$, as shown in FIG. 4. Therefore, when performing image calculations, the intensity of the light should be found based on the shape of the exit pupil 25, which is eclipsed in accordance with the distance s from the vertical line dropped from the apex 45 of the step-like part. The distance d from the center O of the exit pupil 25 to the eclipsed portion 23 and the length 2e of the eclipsed portion 23 are expressed according to Equations (5) and (6) using the numerical aperture $NA_p$ of the projection lens, the height h of the step-like part, and the distance s from a vertical line dropped from the apex 45 of the step-like part.

$$d=\sin \theta=s/\sqrt{(s^2+h^2)} \quad (5)$$

$$e=\sqrt{NA_t^2-d^2}=\sqrt{NA_t^2-(s^2+h^2)} \quad (6)$$

Figure 5:
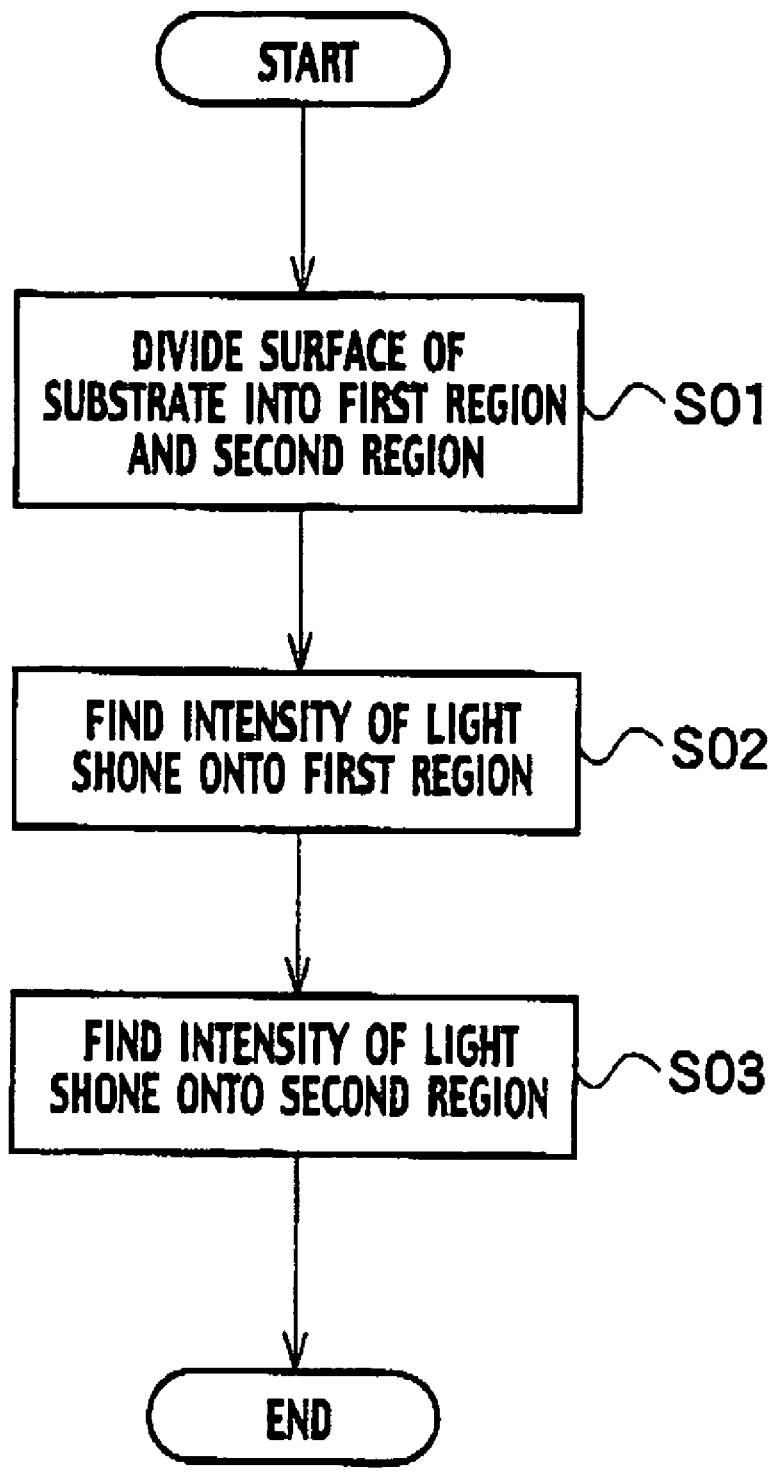
FIG. 5 is a flowchart of a lithography simulation method that uses the lithography simulation apparatus shown in the figures.

FIG. 5 is a flowchart of a lithography simulation method that uses the lithography simulation apparatus shown in the figures. The lithography simulation method will now be explained with reference to FIG. 5.

(a) First in step S01, the region dividing unit 9 shown in FIG. 1 divides the surface of the substrate 29—onto which light that has been focused at a prescribed aperture angle α by the projection lens is shone—into a first region 30 onto which all of the light strikes and a second region 31 onto which only a portion of the light strikes. More specifically, the region dividing unit 9 divides the surface into a second region 31 that is shaded when viewed from the exit pupil 25 and a first region 30 that is not shaded. The dividing is accomplished using the projection optical system constants (including the numerical aperture $NA_p$ of the projection lens and the coherency σ), the height h of the step-like part, and the slope angle of the step-like part.

(b) In step S02, the first light intensity calculating unit 10 of FIG. 1 finds the intensity of the light shone onto the first region 30. More specifically, using Equation (3), the first light intensity calculating unit 10 finds the intensity $I_0(x, y)$ of the portion of the light focused at a prescribed aperture angle α by the projection lens that strikes the first region 30.

(c) Finally in step S03, the second light intensity calculating unit 11 of FIG. 1 finds the intensity of the light shone onto the second region 31. More specifically, using Equation (3), the second light intensity calculating unit 11 finds the intensity $I_0(x, y)$ of the portion of the light focused at a prescribed aperture angle α by the projection lens that strikes the second region 31. Thus, the distribution of the light intensity at the surface of the substrate 29 can be found using the procedure just described.

As described previously, the distribution of the light intensity at the surface of the substrate 29 is calculated based on the shape of the exit pupil 25. Consequently, the calculation can be accomplished in less time than is required by conventional simulation methods using Maxwell's equations. Additionally, the calculation can be accomplished with higher precision than is achieved by conventional simulation methods that assume the incident light and reflected light are parallel. In short, the first embodiment can provide a fast and highly precise lithography simulation method. Also, when the light intensity distribution is the distribution of light intensity in resist, the topography of the resist can be calculated quickly and with high precision.

Figure 6:
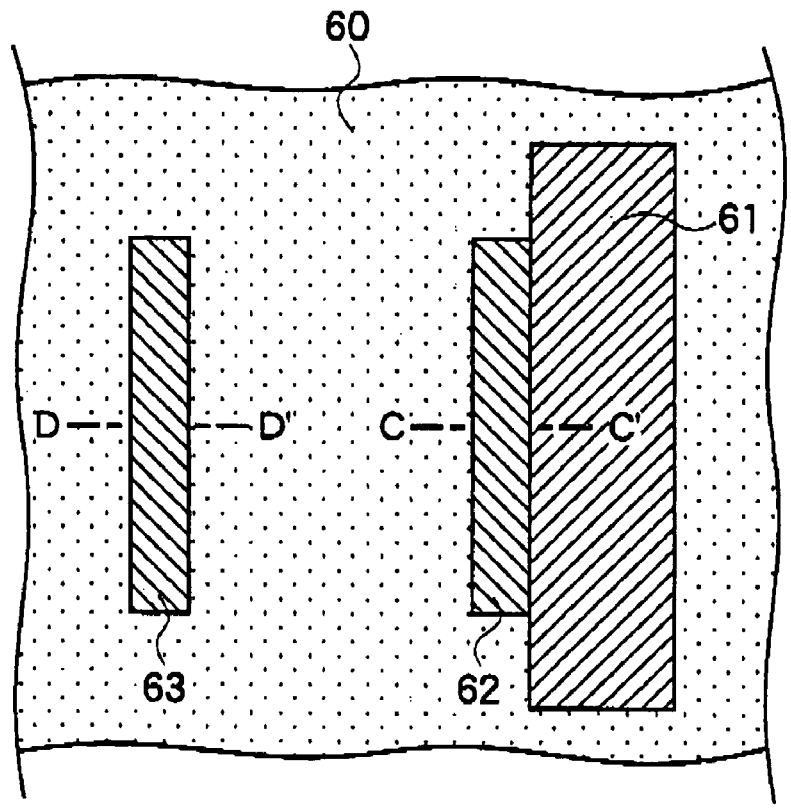
FIG. 6 is a plan view showing a layout in which resist patterns 62, 63 are arranged such that they are parallel to the planar shape of a polysilicon film 61.

The lithography simulation method just described can be expressed as a procedure, i.e., a sequence of processes or operations. Consequently, this method can be converted into a computer program that specifies a plurality of functions to be performed by the processor inside a computer system so that the method can be executed using a computer system. The program can be stored on a recording medium that can be read by the computer and the aforementioned method can be realized in a computerized manner by allowing the computer to read the recording medium and execute the program. The recording medium can be used as the program storage unit 5 shown in FIG. 1 or read by the program storage unit 5, and the program can be used to make the computing unit 1 execute various tasks according to a prescribed processing procedure. Feasible recording media for storing the program include a memory device, a magnetic disk device, an optical disk device, or other device that is capable of recording a program. FIG. 6 is a plan view showing a layout in which resist patterns 62, 63 are arranged such that they are parallel to the planar shape of a polysilicon film 61. As shown in FIG. 6, the a polysilicon film 61 of thickness 200 nm is formed on the substrate 60 and a vertical step-like part of height 200 nm exists around the outside perimeter of the polysilicon film 61. The first resist pattern 62 is formed adjacent to the polysilicon film 61. The second resist pattern 63 is formed 1 μm away from the outside perimeter of the polysilicon film 61. The first and second resist patterns 62, 63 are both 500 nm thick and 250 nm wide. The first resist pattern 62 is disposed inside the second region 31 and the second resist pattern 63 is disposed inside the first region 30.

Figure 7A:
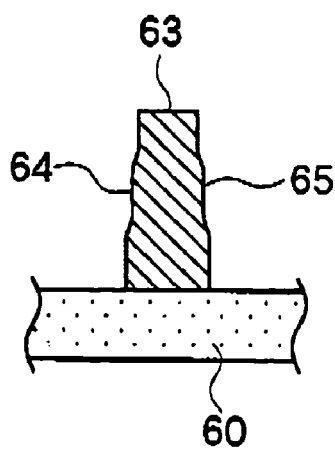
FIG. 7A is a cross sectional view of the second resist pattern 63 taken along the line D–D' of FIG. 6.
Figure 7B:
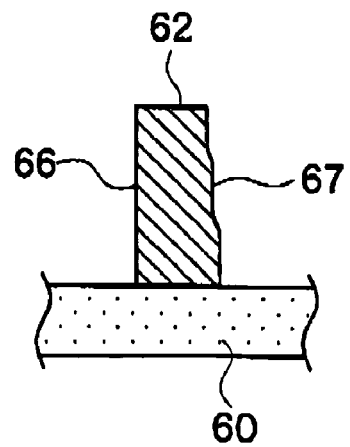
FIG. 7B is a cross sectional view of the first resist pattern 62 taken along the line C–C' of FIG. 6.

FIG. 7A is a cross sectional view of the second resist pattern 63 taken along the line D–D' of FIG. 6. As shown in FIG. 7A, the shapes of the two lateral faces 64, 65 of the second resist pattern 63 are horizontally symmetrical. FIG. 7B is a cross sectional view of the first resist pattern 62 taken along the line C–C' of FIG. 6. As shown in FIG. 7B, the shapes of the two lateral faces 66, 67 of the first resist pattern 62 are horizontally asymmetrical. The reason for the asymmetry is that the degree of overlap with the eclipsed portion 24 is different for the +1-order light 26a, 0-order light 26b, and −1-order light 26c shown in FIG. 2. Also, the width of the first resist pattern 62 is larger at the surface of the substrate 60 than the width of the second resist pattern 63 is because the light intensity is weaker in the second region 31 than in the first region 30.

(Second Embodiment)

Similarly to the first embodiment, a lithography simulation method in accordance with the second embodiment can be achieved using, for example, the lithography simulation apparatus shown in FIG. 1. This lithography simulation apparatus includes a computing unit 1 having functions for calculating the in-plane intensity distribution of light shone onto the surface of the substrate and at least the following units that are connected to the computing unit 1: a projection optical system constant storage unit 2, a substrate topography storage unit 3, a mask pattern storage unit 4, and a program storage unit 5. The computing unit 1 includes a region dividing unit 9 configured to divide the surface of a substrate—onto which light focused to a prescribed aperture angle by a projection lens is shone—into a first region onto which all of the light is shone and a second region onto which only a portion of the light is shone, a first light intensity calculating unit 10 configured to find the intensity of the light shone onto the first region, and a second light intensity calculating unit 11 configured to find the intensity of the light shone onto the second region.

Figure 8:
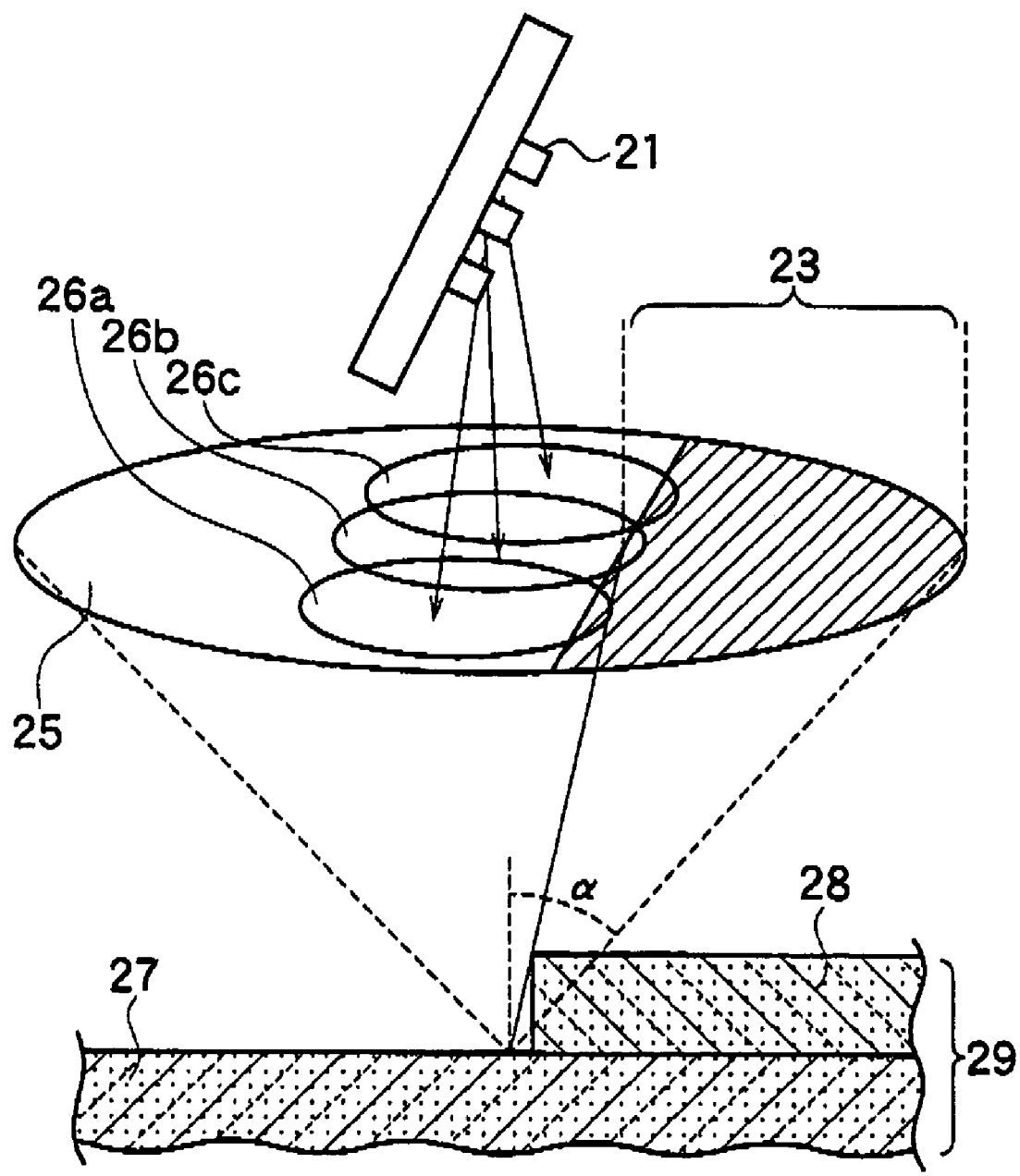
FIG. 8 is a diagrammatic view illustrating the shape of a step-like part of the surface of the substrate and the projection optical system in a case where the mask pattern 21 is perpendicular to the planar shape of a polysilicon film 28 serving as a base pattern.

FIG. 8 is a diagrammatic view illustrating the shape of a step-like part of the surface of the substrate and the projection optical system in a case where the mask pattern 21 is perpendicular to the planar shape of a polysilicon film 28 serving as a base pattern. As shown in FIG. 8, the substrate 29 includes, for example, a semiconductor substrate 27 and a polysilicon film 28 deposited onto the surface of the semiconductor substrate 27. There are step-like parts between the outside perimeter of the polysilicon film 28 and the semiconductor substrate 27. When the mask pattern 21 is perpendicular to the planar shape of the polysilicon film 28 (base pattern), the eclipsed portion 23 of the exit pupil 25 of the projection lens overlaps uniformly with the plurality of diffracted lights generated by the mask pattern 21. More specifically, the +1-order light 26a, 0-order light 26b, and −1-order light 26c of the mask pattern 21 overlap to equal degrees with the eclipsed portion 23 of the exit pupil 25 of the projection lens. When this occurs, it is acceptable to calculate the intensity of the 0-order light 26b alone and it is not necessary to calculate the intensity of the +1-order light 26a and −1-order light 26c. In short, the lithography simulation can be executed using a simple model in which the resolution of the projection lens is not taken into consideration. The 0-order light 26b of the mask pattern 21 indicates the shape of the illumination light source itself and it is sufficient to consider the manner in which the light source is eclipsed. The second embodiment will be described for a case in which the slope angle of the step-like part is normal to the surface of the semiconductor substrate 27. A case in which the slope angle of the step-like part is not vertical will be discussed later with reference to FIG. 11.

Similarly to the first embodiment, the region dividing unit 9 divides the surface of the substrate 29 into a first region 30 where the shape of the light source is not eclipsed and a second region 31 where the shape of the light source is eclipsed.

The first light intensity calculating unit 10 calculates the intensity of the light shone onto the first region 30. The light shone onto the first region 30 is the entirety of the light focused at a prescribed aperture angle α by the projection lens. The intensity distribution I(x, y) is expressed according to Equation (3).

The second light intensity calculating unit 11 finds the intensity of the light shone onto the second region 31, where the shape of the light source is eclipsed. The second region 31 is shaded when viewed from the light source and the intensity of the light shone thereon depends on the height h of the step-like part and the distance s from a vertical line dropped from the apex 45 of the step-like part. The intensity of the light incident on the second region 31 can be determined based on the ratio of the surface area of the portion of shape of the light source that is eclipsed by the step-like part to the surface area of the entire shape of the light source.

When the light source is viewed from a point located at a distance s from a vertical line dropped from the apex 45 of the step-like part as shown in FIG. 3, the light is blocked by the step-like part at the eclipsed portion 23 of the light source shape, which is defined by a circle of radius $NA_p$, as shown in FIG. 4. For the purpose of describing the second embodiment, the exit pupil 25 of FIG. 4 is assumed to indicate the shape of the light source. Thus, the radius of the circuit is the numerical aperture $NA_i$ of the illumination lens. The distance d from the center O of the light source shape to the eclipsed portion 23 and the length 2e of the eclipsed portion 23 are expressed according to Equations (5) and (6) using the numerical aperture NAi of the illumination lens, the height h of the step-like part, and the distance s from a vertical line dropped from the apex of the step-like part. Therefore, the surface area As of the eclipsed portion 23 is expressed according to Equation (7).

$$A_s = \pi \cdot NA_i^2 \cdot \frac{2\gamma}{2\pi} - e \cdot d \tag{7}$$

The surface area Ai of the light source is expressed according to Equation (8).

$$A_i = \pi \cdot NA_p^2 \tag{8}$$

Therefore, the attenuation r(s, h) of the light quantity is expressed according to Equation (9) as a function of s and h.

$$r(s, h) = A_s/A_i \tag{9}$$

Thus, the light intensity $I_1(x, y)$ in the second region 31 (which is shaded by the step-like part) is expressed according to Equation (10) using the light intensity $I_0(x, y)$ of the entire light source given by Equation (3) and the attenuation r(s, h) of the light quantity given by Equation (9).

$$I_1(-s, y) = I_0(-s, y) \times r(s, h) \tag{10}$$

In this way, the second light intensity calculating unit 11 can find the distribution of the light intensity in the vicinity of the step-like part. In other words, the intensity of the light shone onto the second region 31 is found based on the ratio of the surface area of the light source shape as viewed from the second region 31 to the surface area of the light source shape as viewed from the first region 30. The ratio of the surface area of the light source shape as viewed from the second region 31 to the surface area of the light source shape as viewed from the first region 30 is determined by the height h of the step-like part and the distance s from a vertical line dropped from the apex of the step-like part. Also, when the light intensity distribution is the distribution of light intensity in resist, the luminous exposure of the resist can be calculated and the topography of the resist can be calculated.

(Experimental Verification)

Figure 9:
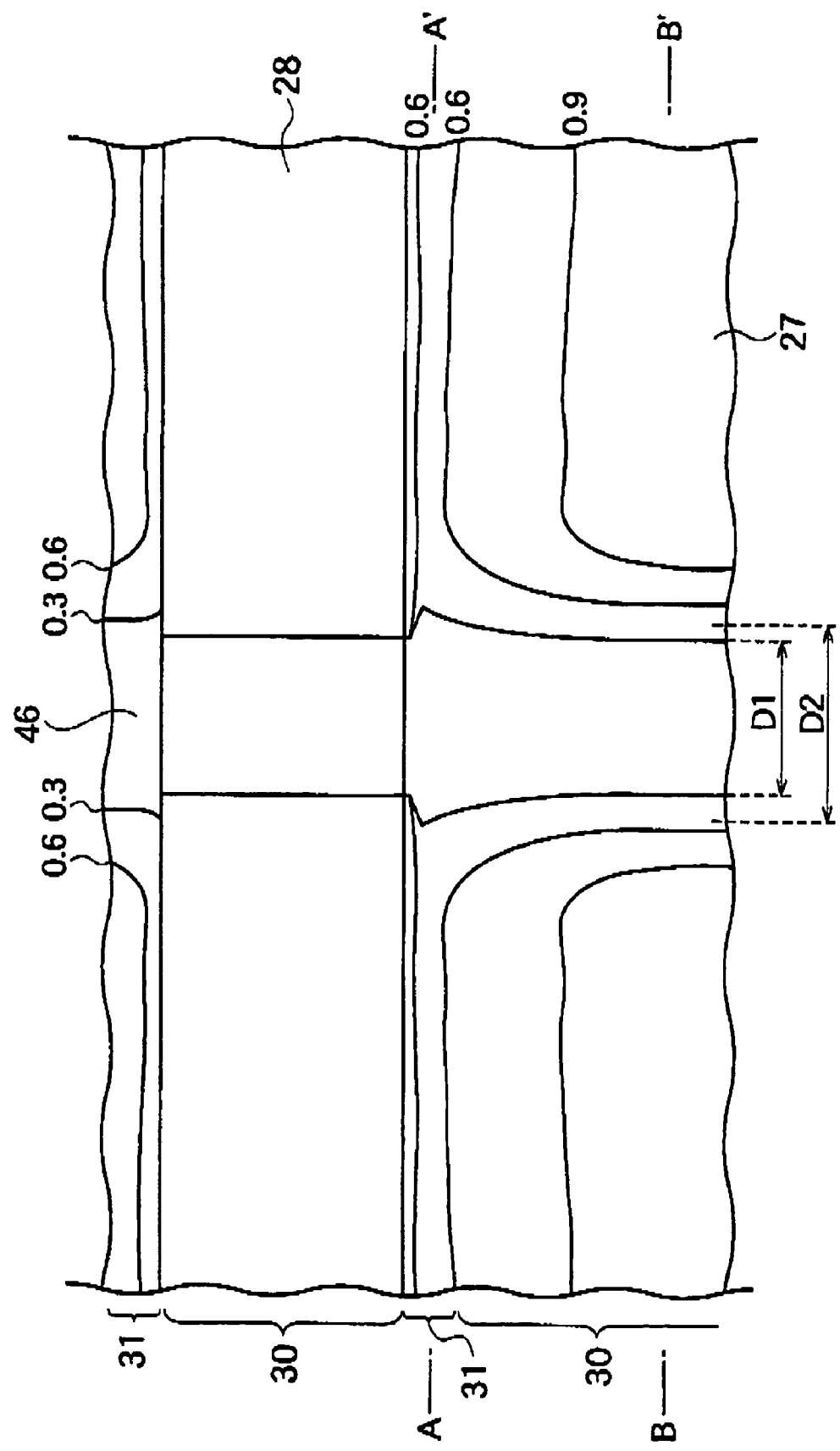
FIG. 9 is a plan view showing the results of a simulation performed using a process simulation method in accordance with the second embodiment.

FIG. 9 is a plan view showing the results of a simulation performed using a process simulation method in accordance with the second embodiment. FIG. 9 shows the in-plane light intensity for a case involving a substrate made up of a semiconductor substrate 27 and a polysilicon film 28 formed on top of the semiconductor substrate in which an exposure pattern 46 that has uniform line widths and is perpendicular to the polysilicon film 28 is transferred to the substrate. The thickness of the polysilicon film 28, i.e., the height of the step-like part, is 200 nm. The exposure pattern has a line width of 0.25 μm and is a positive type exposure pattern, i.e., a pattern formed where the light is not shone. The wavelength of the light is 248 nm, the numerical aperture $NA_p$ of the projection lens is 0.6, and the coherency σ is 0.75. There are step-like parts between the outside perimeter of the polysilicon film 28 and the semiconductor substrate 27. Portions of the surface of the semiconductor substrate 27 in the vicinity of the step-like part correspond to the second region 31 where the light source is eclipsed; all other portions of the surface of the semiconductor substrate 27 and the surface of the polysilicon film 28 correspond to the first region 30 where all of the light shines. As shown in FIG. 9, the light intensity is weaker in the second region 31 than in the first region 30. As a result, the line width D2 of the exposure pattern 46 in the second region 31 is wider than the line width D1 of the same in the first region 30.

Figure 10:
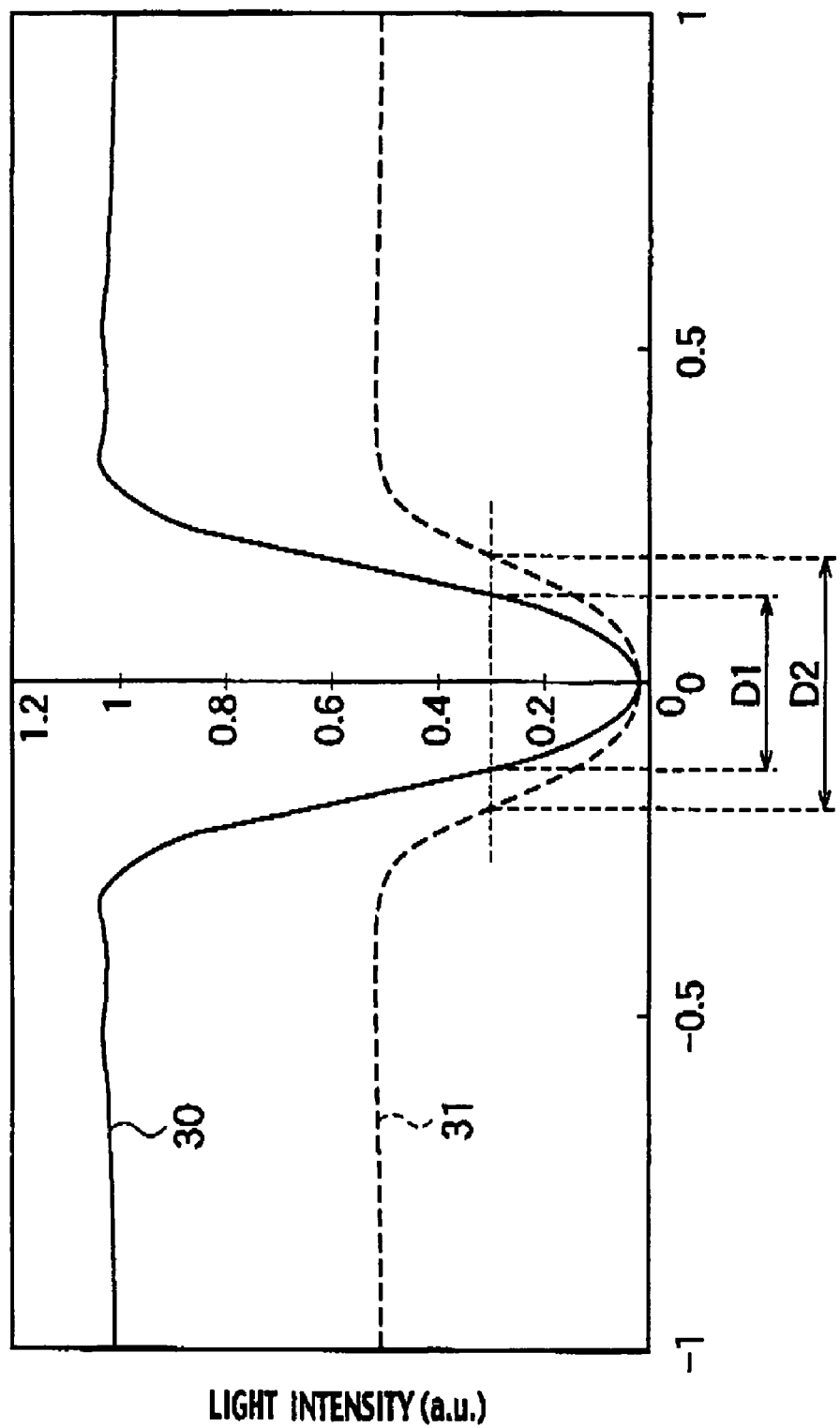
FIG. 10 is a graph showing the distribution of the light intensity in a cross section of the first region 30 indicated by line B–B' in FIG. 9 and the distribution of the light intensity in a cross section of the second region 31 indicated by line A–A'.

FIG. 10 is a graph showing the distribution of the light intensity in a cross section of the first region 30 indicated by line B—B in FIG. 9 and the distribution of the light intensity in a cross section of the second region 31 indicated by line A—A. As shown in FIG. 10, in the cross section B—B of the first region 30 shown in FIG. 9, intense light is shone everywhere except in the domain of the exposure pattern 46 while the intensity of the light decreases rapidly in the domain of the exposure pattern 46. Meanwhile, in the cross section A–A' of the second region 31 shown in FIG. 9, intensity of the light shone everywhere except in the domain of the exposure pattern 46 is approximately half that of the cross section B–B' and the intensity of the light decreases gradually in the domain of the exposure pattern 46. As a result, assuming that regions where the light intensity is 0.3 or less form the exposure pattern 46, the line width D2 in the second region 31 is wider than the line width D1 in the first region 30. These simulation results confirm experimentally, based on an experiment conducted by the inventors, that a process simulation method in accordance with the second embodiment faithfully reproduces an actual photolithography process.

(First Variation)

The first and second embodiments have been described for cases in which the sloped face 32 of the step-like part is normal to the surface of the semiconductor substrate 27, as shown in FIGS. 3 and 8. However, the invention is not limited to such cases and can also be applied to cases in which the sloped face 32 is not normal to the substrate surface.

Figure 11:
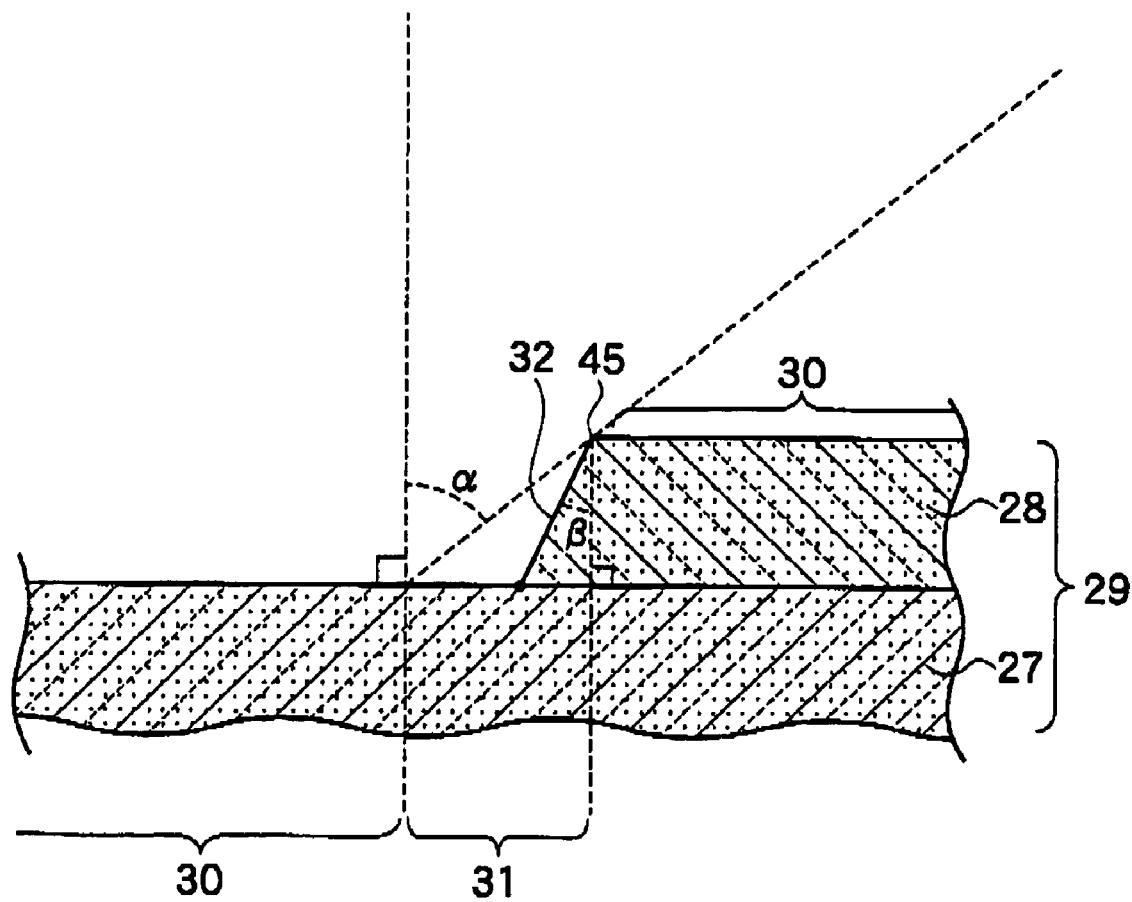
FIG. 11 is a cross sectional view illustrating a case in which the sloped face 32 of the step-like part is not normal to the surface of the semiconductor substrate 27.

FIG. 11 is a cross sectional view illustrating a case in which the sloped face 32 of the step-like-part is not normal to the surface of the semiconductor substrate 27. As shown in FIG. 11, light is focused at an aperture angle $\alpha$ onto a step-like part of a substrate 29 that is made up of a semiconductor substrate 27 and a polysilicon film 28 deposited onto the surface of the semiconductor substrate 27. The sloped face 32 of the polysilicon film 28 is sloped at a prescribed slope angle $\beta$ with respect to a vertical line dropped from the apex 45 of the step-like part. When the slope angle $\beta$ is larger than the aperture angle $\alpha$ of the projection lens, no portion of the exit pupil is eclipsed by the step-like part on the surface of the substrate 29 and a second region 31 is not formed on the surface of the semiconductor substrate 27 in the vicinity of the step-like part. Conversely, when the slope angle $\beta$ is equal to or smaller than the aperture angle $\alpha$ of the projection lens, a portion of the exit pupil is eclipsed by the step-like part on the surface of the substrate 29 as shown in FIG. 11 and a second region 31 is formed which is shaded because not all of the light is shone thereon. In this variation, too, similarly to the first and second embodiments, the region dividing unit 9 (shown in FIG. 1) can divide the surface into first and second regions 30, 31 and the second light intensity calculating unit 11 can calculate the intensity of the light shone onto the second region 31 based on the height h of the step-like part and the distance s from a vertical line dropped from the apex 45 of the step-like part. Therefore, a quick and highly precise lithography simulation can be executed even when the sloped face 32 is not vertical.

(Second Variation)

Lithography simulation methods in accordance with the first and second embodiments can also be applied to cases in which a material that transmits light is coated or deposited onto a semiconductor substrate having a step-like part.

Figure 12:
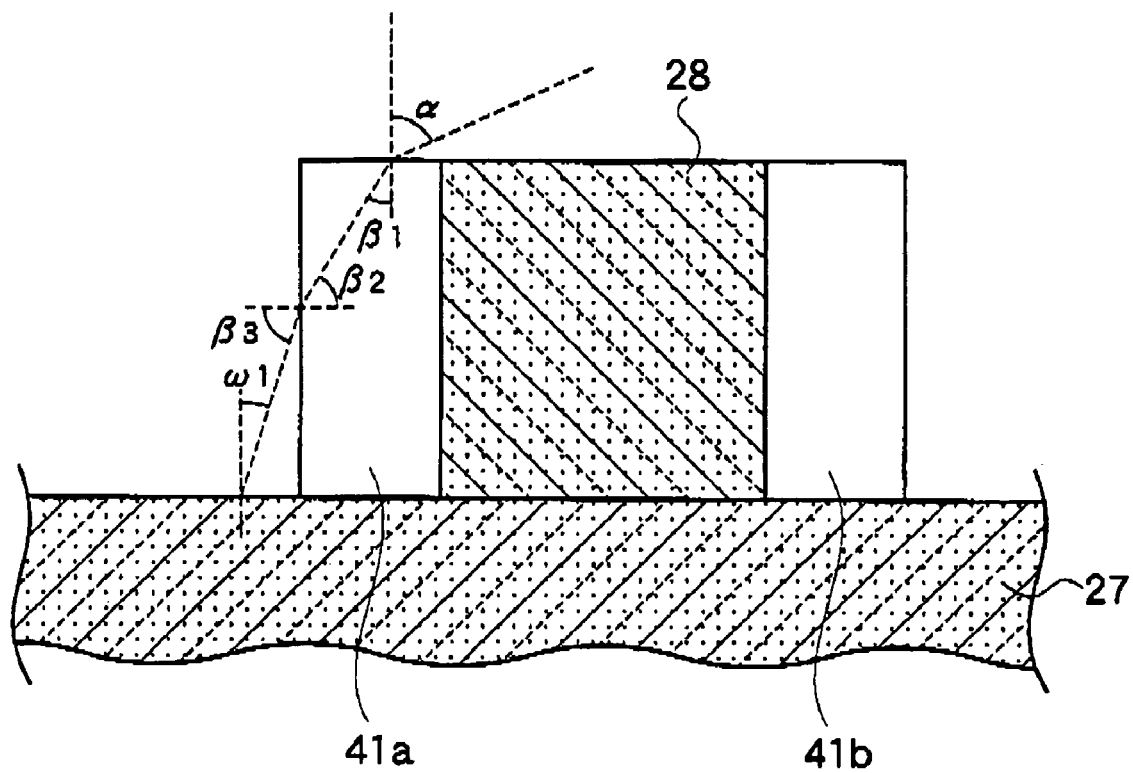
FIG. 12 is a plan view illustrating the refraction of the light in a case where light-transmissive materials 41a, 41b are arranged on the semiconductor substrate 27.

FIG. 12 is a plan view illustrating the refraction of the light in a case where light-transmissive materials 41a, 41b are arranged on the semiconductor substrate 27. As shown in FIG. 12, the substrate includes a semiconductor substrate 27, a polysilicon film 28 deposited onto the surface of the semiconductor substrate 27, and light-transmissive materials 41a, 41b. The light-transmissive materials 41a, 41b are so arranged as to contact the lateral faces of the polysilicon film 28. The refractive index of the light-transmissive materials 41a, 41b is n1 and the top surface and lateral faces of the light-transmissive materials 41a, 41b are parallel and normal, respectively, to the surface of the semiconductor substrate 27. A portion of the light shone onto the top surface of the light-transmissive material 41a at an incident angle $\alpha$ enters the light-transmissive material 41a at a refraction angle $\beta1$. A portion of the light striking the lateral surface of the light-transmissive material 41a at an incident angle $\beta2$ exits the light-transmissive material 41a at a refraction angle $\beta3$. Thereafter, the light strikes the surface of the semiconductor substrate 27 at an incident angle of $\omega1$. The angles $\alpha$, $\beta1$, $\beta2$, $\beta3$, and $\omega1$ satisfy Equations (11) and (12). Thus, the incident angle $\omega1$ at which the light strikes the semiconductor substrate 27 can be found using Snell's law while considering the topography of the substrate and the refractive indices of the light-transmissive materials 41a, 41b, making it possible to implement a lithography simulation method in accordance with the first embodiment.

$$\sin \alpha / \sin \beta_1 = \sin \beta_3 / \sin \beta_2 = n_1 \quad (11)$$

$$\beta_1^2 + \beta_2^2 = \beta_3^2 \omega_1^2 = (\pi/2)^2 \quad (12)$$

Figure 13:
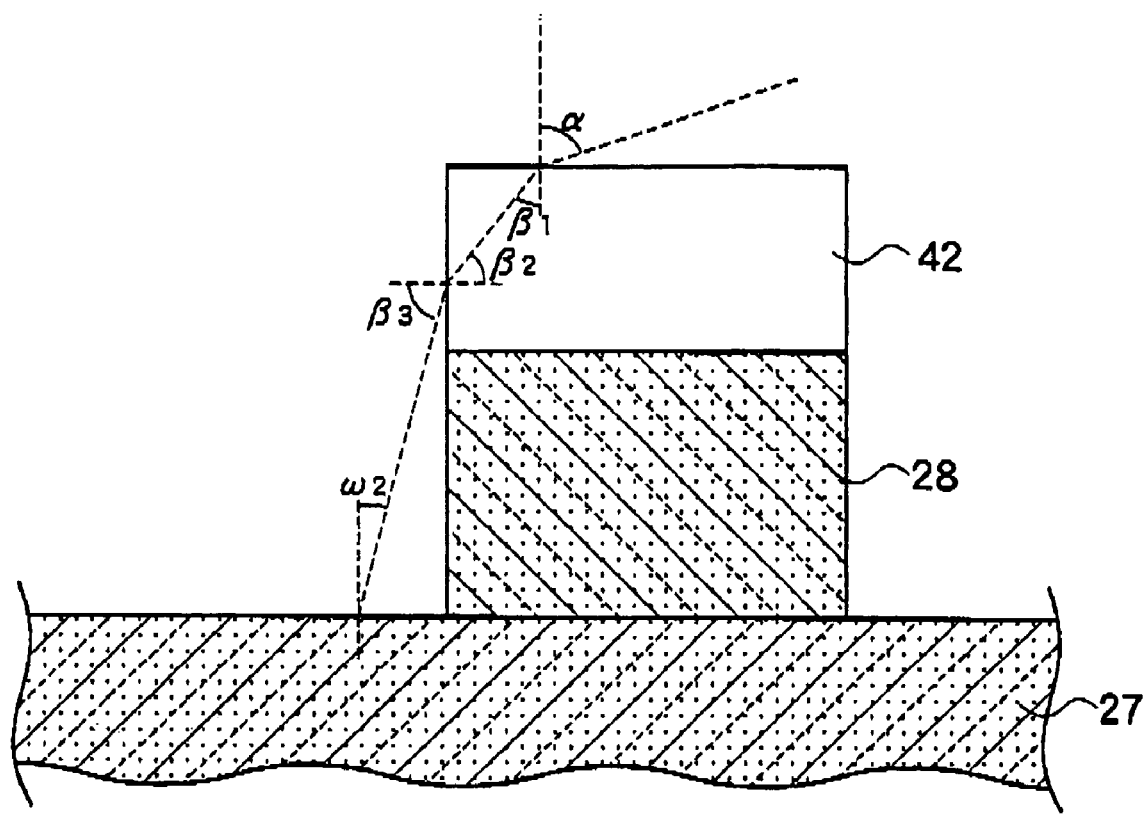
FIG. 13 is a cross sectional view illustrating the refraction of the light in a case where a light-transmissive material 42 are arranged on the semiconductor substrate 27.

FIG. 13 is a cross sectional view illustrating the refraction of the light in a case where a light-transmissive material 42 are arranged on the semiconductor substrate 27. As shown in FIG. 13, the substrate includes a semiconductor substrate 27, a polysilicon film 28 deposited on top of the semiconductor substrate 27, and a light-transmissive material 42 arranged on top of the polysilicon film 28. The light-transmissive materials 42 is so arranged as to contact the top surface of the polysilicon film 28. The refractive index of the light-transmissive material 42 is $n_2$ and the top surface and lateral faces of the light-transmissive material 42 are parallel and normal, respectively, to the surface of the semiconductor substrate 27. A portion of the light shone onto the surface of the light-transmissive material 42 at an incident angle $\alpha$ enters the light-transmissive material 42 at a refraction angle $\beta_1$. A portion of the light striking the lateral surface of the light-transmissive material 42 at an incident angle $\beta_2$ exits the light-transmissive material 42 at a refraction angle $\beta_3$. Thereafter, the light strikes the surface of the semiconductor substrate 27 at an incident angle of $\omega_2$. The angles $\alpha$, $\beta_1$, $\beta_2$, $\beta_3$ and $\omega_2$ satisfy Equations (13) and (14).

$$\sin \alpha / \sin \beta_1 = \sin \beta_3 / \sin \beta_2 = n_2 \quad (13)$$

$$\beta_1^1 + \beta_2^2 = \beta_3^2 + \omega_2^2 = (\pi/2)^2 \quad (14)$$

Thus, the incident angles $\omega_1$, and $\omega_2$ at which the light strikes the semiconductor substrate 27 can be found using Snell's law while considering the topography of the substrate and the refractive indices of the light-transmissive materials 41a, 41b, 42, making it possible to execute a quick and highly precise lithography simulation. Examples of light-transmissive materials 41a, 41b, 42 include oxide films ($SiO_2$) and nitride films ($Si_3N_4$)

(Third Variation)

Figure 14:
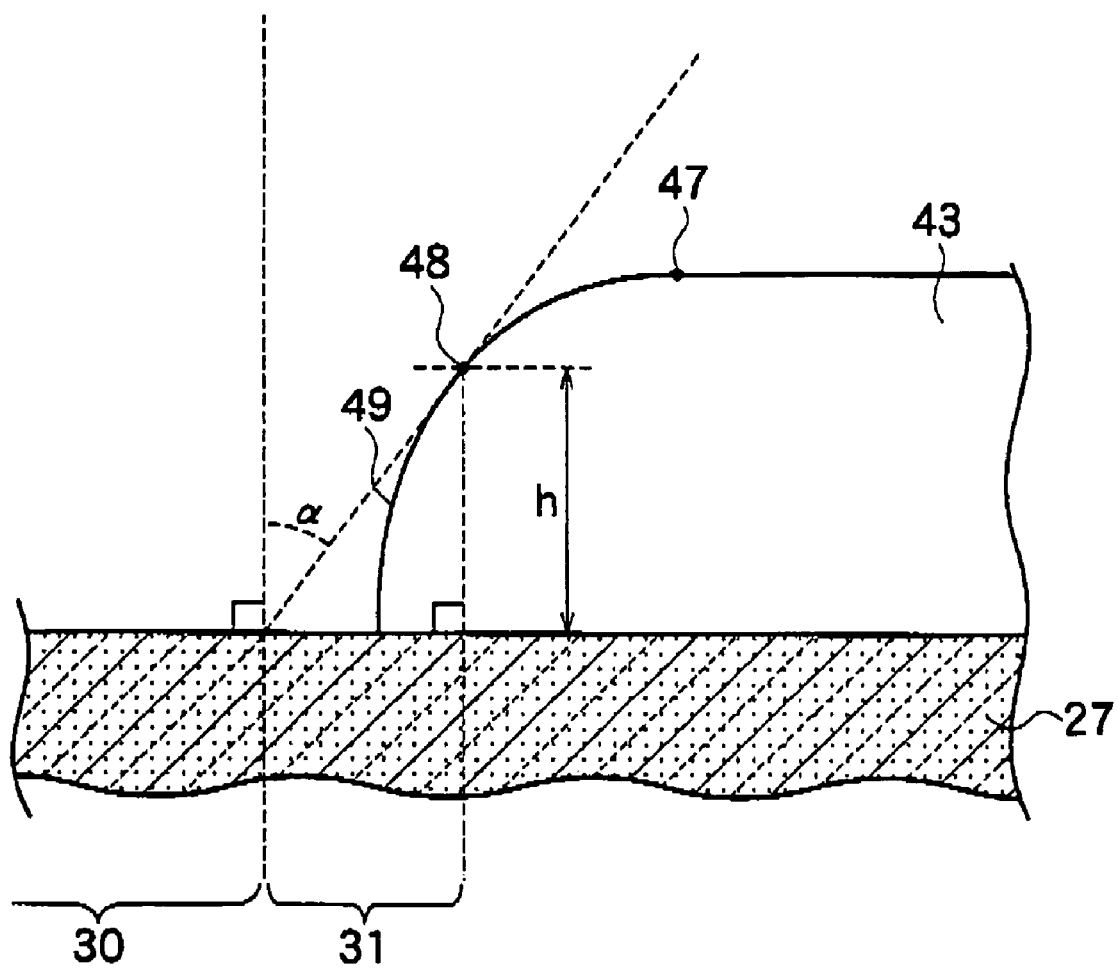
FIG. 14 is a cross sectional view illustrating a method of identifying the eclipsed portion of the light when the slope angle of the sloped face of the step-like part varies.

FIG. 14 is a cross sectional view illustrating a method of identifying the eclipsed portion of the light when the slope angle of the sloped face of the step-like part varies. As shown in FIG. 11, when the slope angle $\beta$ of the sloped face 32 is uniform, the region dividing unit 9 (shown in FIG. 1) can determine if a second region 31 exists by comparing the slope angle $\beta$ with the aperture angle $\alpha$ of the projection lens. When the slope angle of the sloped face 49 of the step-like part varies within the sloped face 49 shown in FIG. 14, however, the region dividing unit 9 must determine the second region 31 while considering the slope angle at every point along the sloped face 49.

The substrate includes a semiconductor substrate 27 and a deposited material 43 deposited onto the semiconductor substrate 27. The exposed surface of the deposited material 43 begins to slope gently with respect to the surface of the semiconductor substrate 27 at a slope start point 47 and the slope angle increases such that said exposed surface is approximately normal to the surface of semiconductor substrate 27 when it reaches that surface. When the slope angle of the sloped surface 49 of the deposited material 43 is larger than incident angle $\alpha$ of the light, a second region where the step-like part casts a shadow is not formed. Conversely, when the slope angle of the sloped surface 49 of the deposited material 43 is equal to or smaller than incident angle $\alpha$ of the light, a second region where the step-like part casts a shadow is formed Therefore, the region dividing unit 9 (shown in FIG. 1) compares the slope angle at each point on the sloped face with the incident angle α of the light and divides the substrate surface into first and second regions 30, 31 based on the distance 5 from a vertical line dropped from each point on the sloped face in the case shown in FIG. 14, the point on the sloped face 49 where the slope angle of the sloped face 49 equals the incident angle α of the light is defined as the apex 48 and the substrate surface is divided into first and second regions 30, 31 based on the height h of the apex 48 and the distance from a vertical line dropped from the apex 48.

Thus, a quick and highly precise lithography simulation can be executed even when the slope angle of the sloped face 49 of the step-like part varies within the sloped face 49.

(Third Embodiment)

Figure 15:
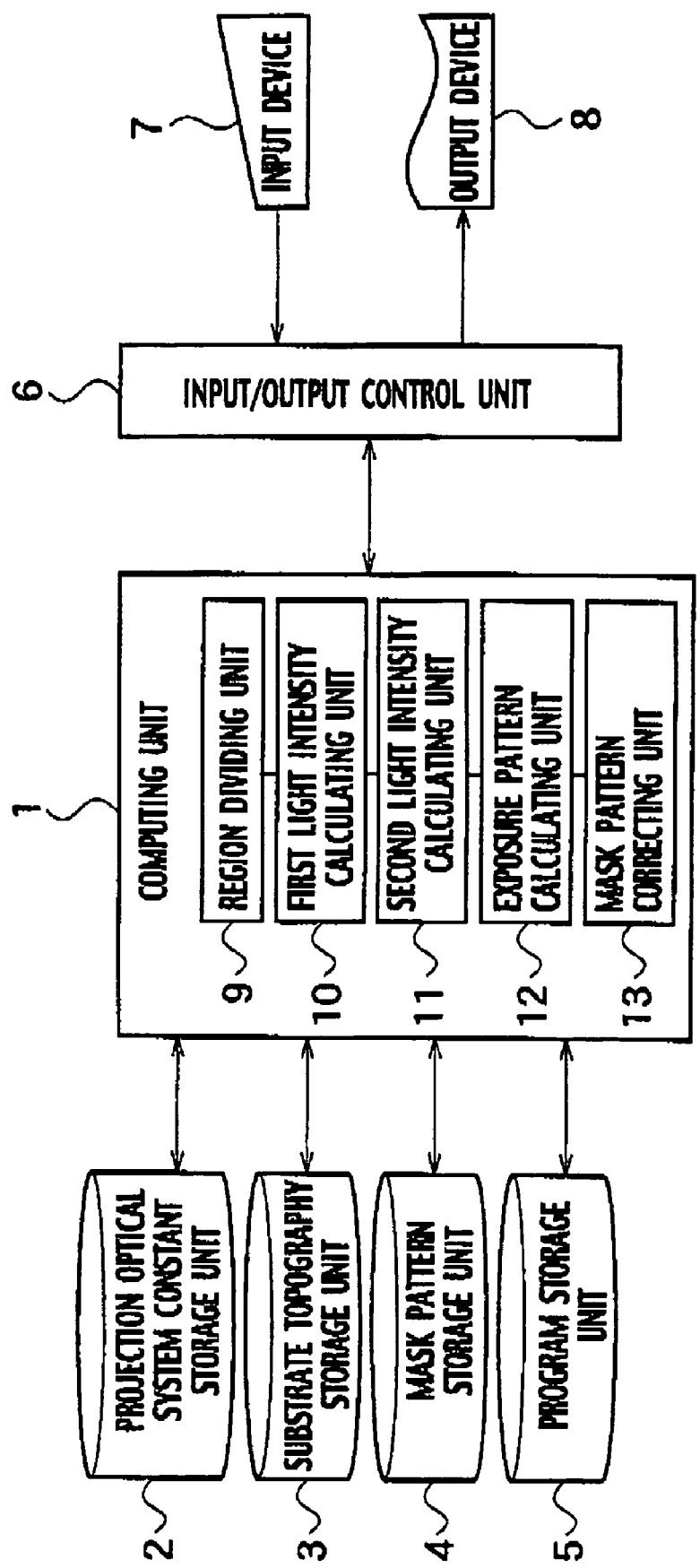
FIG. 15 is a block diagram of a mask pattern correcting apparatus used to implement a mask pattern correction method in accordance with a third embodiment.

FIG. 15 is a block diagram of a mask pattern correcting apparatus used to implement a mask pattern correction method in accordance with a third embodiment. This mask pattern correcting apparatus includes a computing unit 1 having functions for calculating the in-plane intensity distribution of light shone onto the surface of the substrate 29 and at least the following units that are connected to the computing unit 1: a projection optical system constant storage unit 2, a substrate topography storage unit 3, a mask pattern storage unit 4, and a program storage unit 5. The computing unit 1 includes a region dividing unit 9 configured to divide the surface of a substrate 29—onto which light focused to a prescribed aperture angle α by a projection lens is shone—into a first region 30 onto which all of the light is shone and a second region 31 onto which only a portion of the light is shone, a first light intensity calculating unit 10 configured to find the intensity of the light shone onto the first region 30, a second light intensity calculating unit 11 configured to find the intensity of the light shone onto the second region 31, a projection pattern calculating unit 12 configured to calculate an exposure pattern 46 to be transferred to the substrate 29 using a mask pattern 21 based on the intensities of the light shone onto the first and second regions 30, 31, and a mask pattern correcting unit 13 configured to correct the shape of the mask pattern in such a manner as to reduce the amount of variation between the exposure pattern 46 and the desired design pattern.

Through an input/output control unit 6, the computing unit 1 is connected to an input device 7 configured to receive data, commands, and other input from an operator and an output device 8 configured to output the distribution of the light intensity at the surface of the substrate. The program storage unit 5 stores in a fixed manner a computer-readable program for correcting the mask pattern.

Based on the light intensity distribution, the exposure pattern calculating unit 12 calculates the shape of the exposure pattern that will be formed on the resist coated onto the substrate 29. The mask pattern correcting unit 13 compares the desired design pattern, i.e., the pattern one wishes to form on the resist, to the calculated exposure pattern, extracts the amount of variation between the two, and corrects the mask pattern 21 in such a manner as to reduce the amount of variation.

Figure 16:
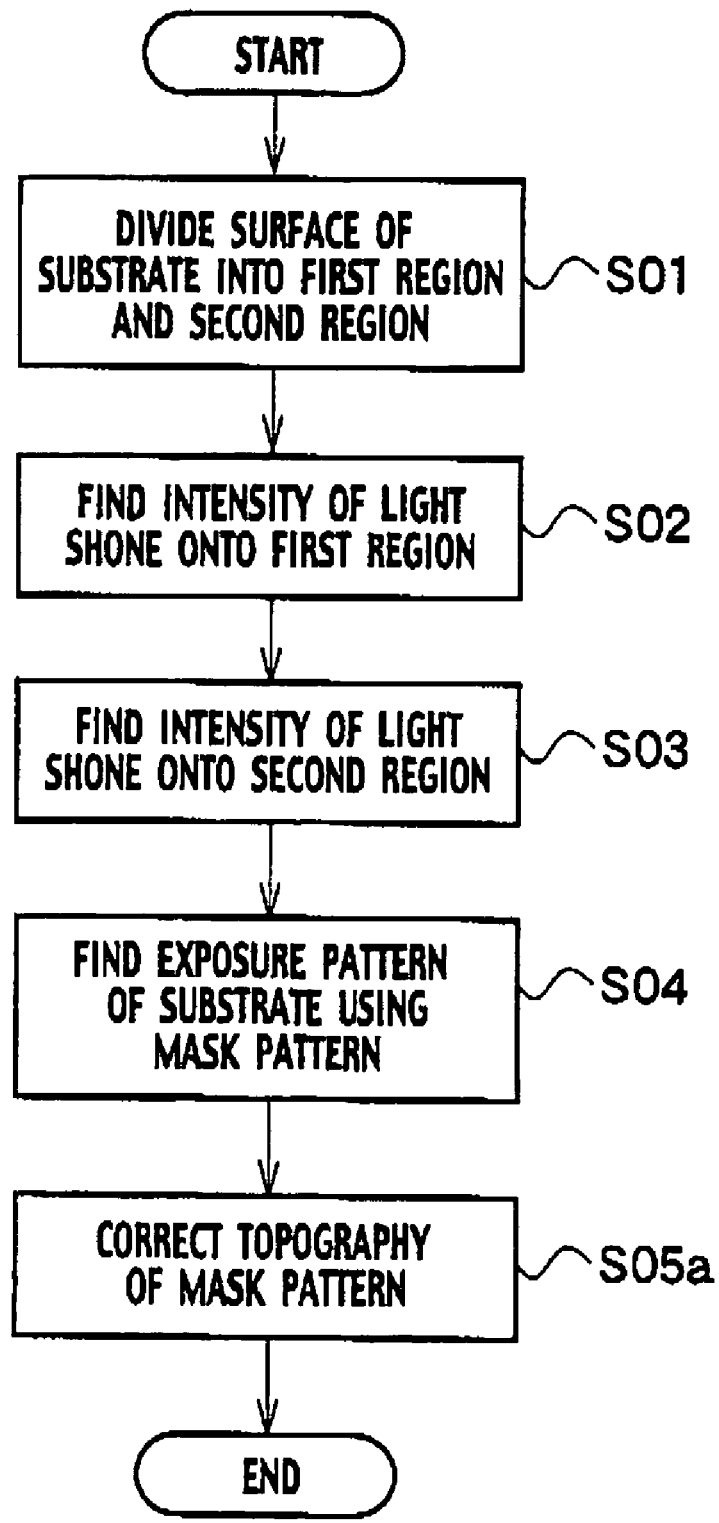
FIG. 16 is a flowchart of a mask pattern correction method that uses the mask pattern correcting apparatus shown in FIG. 15.

FIG. 16 is a flowchart of a mask pattern correction method that uses the mask pattern correcting apparatus shown in FIG. 15. A mask pattern correction method that uses the mask pattern correcting apparatus shown in FIG. 15 will now be described.

(a) First, in step S01, the region dividing unit 9 shown in FIG. 15 divides the surface of the substrate 29—onto which light that has been focused at a prescribed aperture angle α by the projection lens is shone—into a first region 30 onto which all of the light strikes and a second region 31 onto which only a portion of the light strikes. More specifically, the region dividing unit 9 divides the surface into a second region 31 that is shaded when viewed from the exit pupil and a first region 30 that is not shaded. The dividing is accomplished using the projection optical system constants (including the numerical aperture $NA_p$ of the projection lens and the coherency σ), the height h of the step-like part, and the slope angle of the step-like part.

(b) In step S02, the first light intensity calculating unit 10 of FIG. 15 finds the intensity of the light shone onto the first region 30. More specifically, using Equation (3), the first light intensity calculating unit 10 finds the intensity $I_0(x, y)$ of the entirety of the light focused at a prescribed aperture angle α by the projection lens.

(c) In step S03, the second light intensity calculating unit 11 of FIG. 15 finds the intensity of the light shone onto the second region 31. More specifically, using Equation (3), the second light intensity calculating unit 11 finds the intensity $I_0(x, y)$ of the portion of the light focused at a prescribed aperture angle α by the projection lens that strikes the second region 31. Thus, the intensity distribution of the light at the surface of the substrate 29 can be found using the steps just described.

(d) In step S04, the exposure pattern calculating unit 12 of FIG. 15 calculates the exposure pattern 46 to be transferred to the substrate 29 using a mask pattern 21 based on the intensity of the light shone onto the first and second regions 30, 31.

(e) Finally, in step S05, the mask pattern correcting unit 13 of FIG. 15 corrects the shape of the mask pattern in such a manner as to reduce the amount of variation between the exposure pattern 46 and the desired design pattern.

Thus, as previously explained, the exposure pattern is calculated based on the intensity of the light shone on the first and second regions 30, 31, the exposure pattern is compared to the design pattern, and corrections are applied to the mask pattern. Consequently, the mask pattern can be corrected in less time than is required with a conventional simulation method using Maxwell's equations. Furthermore, the mask pattern can be corrected with higher precision that is achieved with conventional simulation methods that assume parallel light. In short, the third embodiment can provide a fast and highly precise mask pattern correction method.

(Fourth Embodiment)

Figure 17:
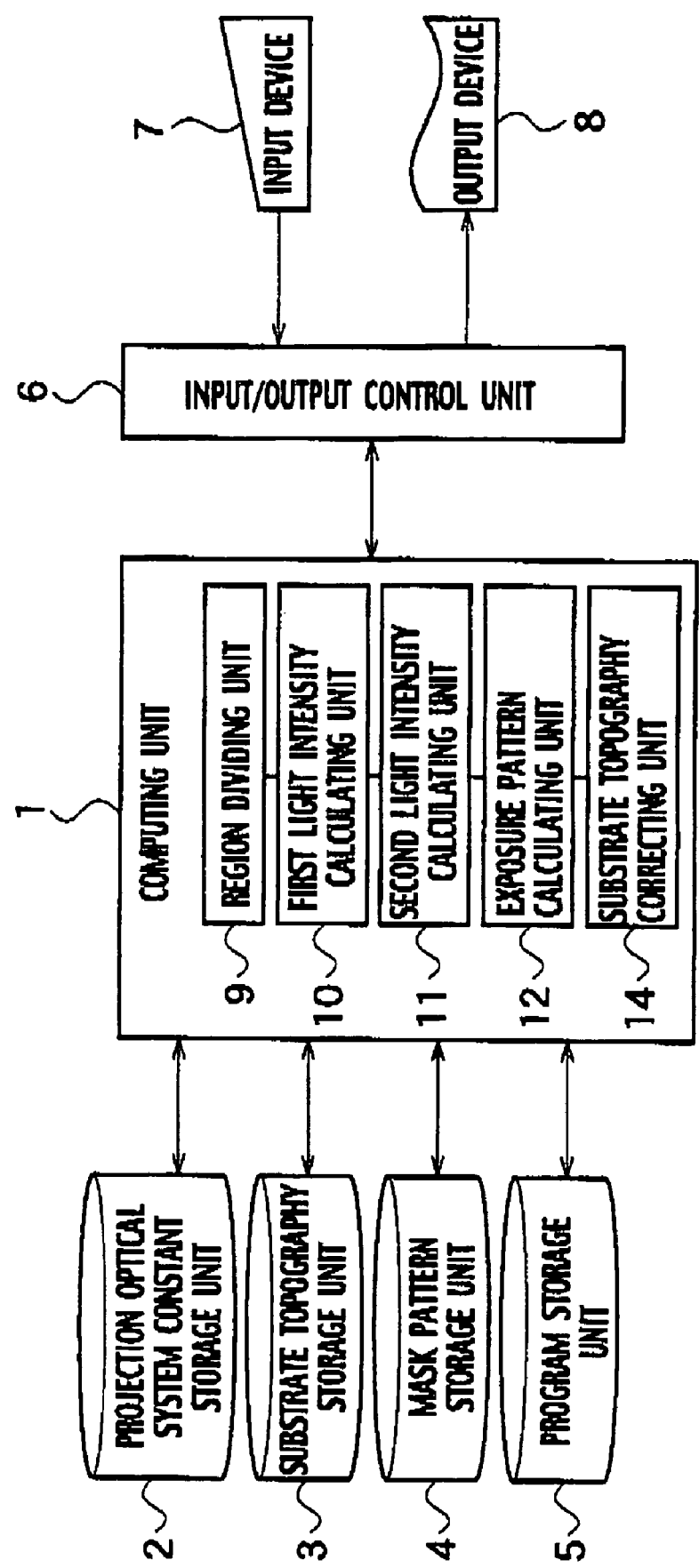
FIG. 17 is a block diagram of a substrate topography correcting apparatus used to implement a substrate topography correction method in accordance with a fourth embodiment.

FIG. 17 is a block diagram of a substrate topography correcting apparatus used to implement a substrate topography correction method in accordance with a fourth embodiment. A substrate topography correction method in accordance with the fourth embodiment can be achieved using, for example, the substrate topography correcting apparatus shown in FIG. 17. The substrate topography correcting apparatus includes a computing unit 1 having functions for calculating the in-plane intensity distribution of light shone onto the surface of the substrate 29 and at least the following units that are connected to the computing unit 1: a projection optical system constant storage unit 2, a substrate topography storage unit 3, a mask pattern storage unit 4, and a program storage unit 5. The computing unit 1 includes a region dividing unit 9 configured to divide the surface of a substrate 29—onto which light focused to a prescribed aperture angle α by a projection lens 25 [sic] is shone—into a first region 30 onto which all of the light is shone and a second region 31 onto which only a portion of the light is shone, a first light intensity calculating unit 10 configured to find the intensity of the light shone onto the first region 30, a second light intensity calculating unit 11 configured to find the intensity of the light shone onto the second region 31, a projection pattern calculating unit 12 configured to calculate an exposure pattern 46 to be transferred to the substrate 29 based on the intensities of the light shone onto the first and second regions 30, 31, and a substrate topography correcting unit 14 configured to correct the topography of the substrate 29 in such a manner as to reduce the amount of variation between the exposure pattern 46 and the desired design pattern.

Through an input/output control unit 6, the computing unit 1 is connected to an input device 7 configured to receive data, commands, and other input from an operator and an output device 8 configured to output the distribution of the light intensity at the surface of the substrate. The program storage unit 5 stores in a computer-readable program for correcting the topography of the substrate 29.

Based on the light intensity distribution, the exposure pattern calculating unit 12 calculates the shape of the exposure pattern that will be formed on the resist coated onto the substrate 29. The substrate topography correcting unit 14 compares the desired design pattern, i.e., the pattern one wishes to form on the resist, to the calculated exposure pattern, extracts the amount of variation between the two, and corrects the topography of the substrate 29 in such a manner as to reduce the amount of variation.

Figure 18:
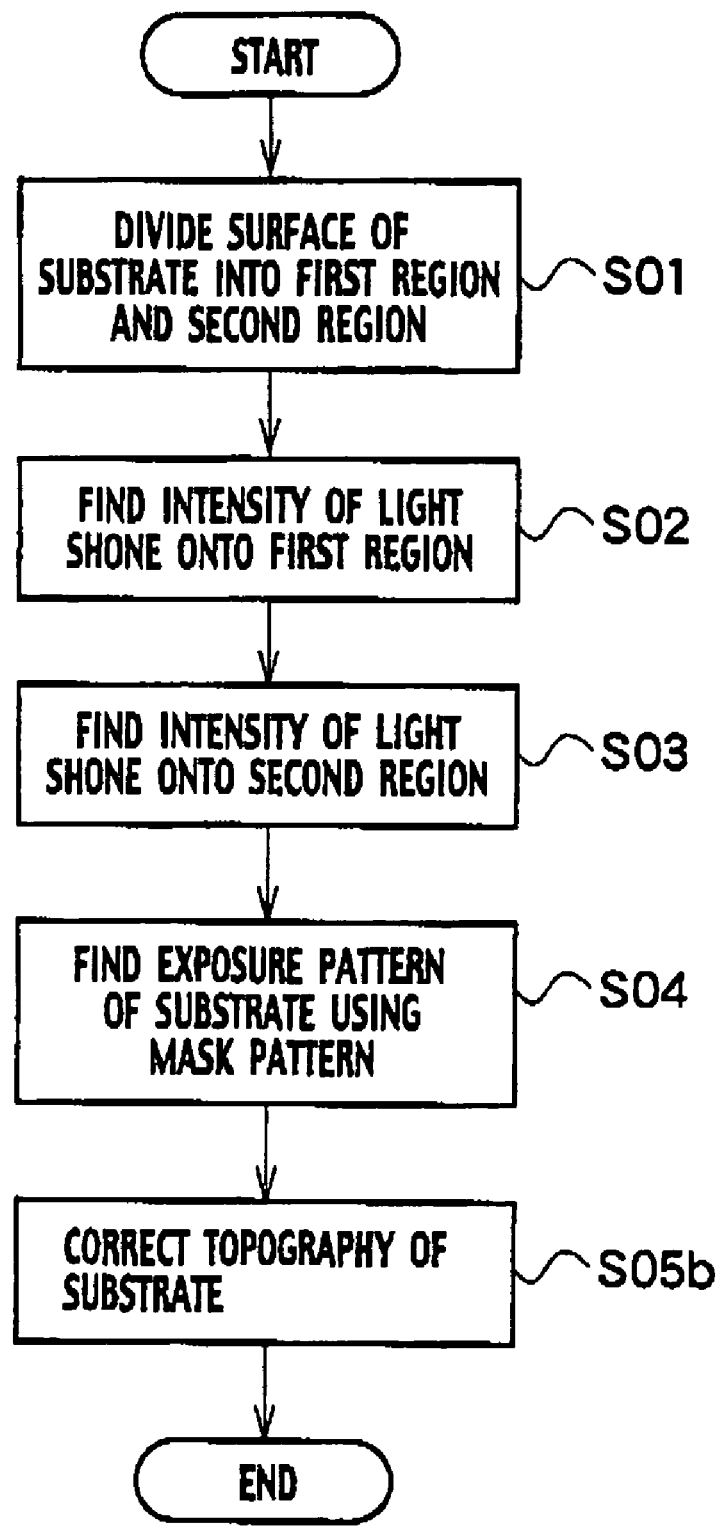
FIG. 18 is a flowchart of a substrate topography correction method that uses the substrate topography correcting apparatus shown in FIG. 17.

FIG. 18 is a flowchart of a substrate topography correction method that uses the substrate topography correcting apparatus shown in FIG. 17. A substrate topography correction method that uses the substrate topography correcting apparatus shown in FIG. 17 will now be described with reference to FIG. 18.

(a) First, in step S01, the region dividing unit 9 shown in FIG. 17 divides the surface of the substrate 29—onto which light that has been focused at a prescribed aperture angle $\alpha$ by the projection lens is shone—into a first region 30 onto which all of the light strikes and a second region 31 onto which only a portion of the light strikes. More specifically, the region dividing unit 9 divides the surface into a second region 31 that is shaded when viewed from the exit pupil and a first region 30 that is not shaded. The dividing is accomplished using the projection optical system constants (including the numerical aperture $NA_p$ of the projection lens and the coherency $\sigma$), the height h of the step-like part, and the slope angle of the step-like part.

(b) In step S02, the first light intensity calculating unit 10 of FIG. 17 finds the intensity of the light shone onto the first region 30. More specifically, using Equation (3), the first light intensity calculating unit 10 finds the intensity $I_0(x, y)$ of the entirety of the light focused at a prescribed aperture angle $\alpha$ by the projection lens.

(c) In step S03, the second light intensity calculating unit 11 of FIG. 17 finds the intensity of the light shone onto the second region 31. More specifically, using Equation (3), the second light intensity calculating unit 11 finds the intensity $I_0(x, y)$ of the portion of the light focused at a prescribed aperture angle $\alpha$ by the projection lens that strikes the second region 31. Thus, the intensity distribution of the light at the surface of the substrate 29 can be found using the steps just described.

(d) In step S04, the exposure pattern calculating unit 12 of FIG. 17 calculates the exposure pattern 46 to be transferred to the substrate 29 based on the intensity of the light shone onto the first and second regions 30, 31.

(e) Finally, in step S05, the substrate topography correcting unit 14 of FIG. 17 corrects the topography of the substrate 29 in such a manner as to reduce the amount of variation between the exposure pattern 46 and the desired design pattern.

Thus, as previously explained, the exposure pattern is calculated based on the intensity of the light shone on the first and second regions 30, 31, the exposure pattern is compared to the design pattern, and corrections are applied to the substrate topography. Consequently, the substrate topography can be corrected in less time than is required with a conventional simulation method using Maxwell's equations. Furthermore, the substrate topography can be corrected with higher precision that is achieved with conventional simulation methods that assume parallel light. In short, the fourth embodiment provides a fast and highly precise substrate topography correction method.

Although the present invention has been described heretofore using the first through fourth embodiments and variations thereof, descriptions and drawings forming a portion of this disclosure should not be construed to limit this invention. It is believed that this disclosure will make various alternative embodiments, working examples, and applied technologies obvious to those skilled in the art.

As described previously, the present invention makes it possible to provide a lithography simulation method, a mask pattern correction method, and a substrate topography correction method, each of which is fast and highly precise.

What is claimed is:

1. A method of lithography simulation comprising:
   dividing a surface of a substrate onto which light that is focused at an aperture angle by a projection lens is shone into a first region onto which all of the light strikes and a second region onto which a portion of the light strikes;
   calculating an intensity of the light shone onto the first region; and
   calculating an intensity of the light shone onto the second region.

2. The method of lithography simulation of claim 1, wherein the second region is a region where the remaining portion of the light is blocked by a step-like part on said surface having a slope angle smaller than said aperture angle.

3. The method of lithography simulation of claim 2, wherein when a mask pattern that is perpendicular to the step-like part is transferred to the substrate, the intensity of the light shone onto the second region is calculated based on the ratio of the surface area of the shape of the light source of the projection lens as viewed from the second region to the surface area of the shape of said light source as viewed from the first region.

4. The method of lithography simulation of claim 2, wherein calculating the intensity of the light shone onto the second region is carried out based on an eclipsed shape of an exit pupil of said projection lens blocked by the step-like part.

5. The method of lithography simulation of claim 3, wherein the ratio of the surface area of the light source shape as viewed from the second region to the surface area of the light source shape as viewed from the first region is determined by the height of the step-like part and the distance from a vertical line dropped from the apex of the step-like part.

6. The method of lithography simulation of claim 1, wherein when a substance that transmits the light is disposed on the substrate, the aperture angle is set using Snell's law and the refractive index of the substance.

7. A method of mask pattern correction comprising:
dividing a surface of a substrate onto which light that is focused at an aperture angle by a projection lens is shone into a first region onto which all of the light strikes and a second region onto which a portion of the light strikes;
calculating an intensity of the light shone onto the first region;
calculating an intensity of the light shone onto the second region;
calculating an exposure pattern to be transferred to the substrate using a mask pattern based on the intensities of the light shone onto the first and second regions; and
correcting the shape of mask pattern in such a manner as to reduce the amount of deviation of the exposure pattern from a desired design pattern.

8. The method of mask pattern correction of claim 7, wherein the second region is a region where the remaining portion of the light is blocked by a step-like part on said surface having a slope angle smaller than said aperture angle.

9. The method of mask pattern correction of claim 8, wherein when a mask pattern that is perpendicular to the step-like part is transferred to the substrate, the intensity of the light shone onto the second region is calculated based on the ratio of the surface area of the shape of the light source of the projection lens as viewed from the second region to the surface area of the shape of said light source as viewed from the first region.

10. The method of mask pattern correction of claim 8, wherein calculating the intensity of the light shone onto the second region is carried out based on an eclipsed shape of an exit pupil of said projection lens blocked by the step-like part.

11. The method of mask pattern correction of claim 9, wherein the ratio of the surface area of the light source shape as viewed from the second region to the surface area of the light source shape as viewed from the first region is determined by the height of the step-like part and the distance from a vertical line dropped from the apex of the step-like part.

12. The method of mask pattern correction of claim 7, wherein when a substance that transmits the light is disposed on the substrate, the aperture angle is set using Snell's law and the refractive index of the substance.

13. A method of substrate topography correction comprising:
dividing a surface of a substrate onto which light that is focused at an aperture angle by a projection lens is shone into a first region onto which all of the light strikes and a second region onto which a portion of the light strikes;
calculating an intensity of the light shone onto the first region;
calculating an intensity of the light shone onto the second region;
calculating an exposure pattern to be transferred to the substrate based on the intensities of the light shone onto the first and second regions; and
correcting the topology of the substrate in such a manner as to reduce the amount of deviation of the exposure pattern from a desired design pattern.

14. The method of substrate topography correction of claim 13, wherein the second region is a region where the remaining portion of the light is blocked by a step-like part on said surface having a slope angle smaller than said aperture angle.

15. The method of substrate topography correction of claim 14, wherein when a mask pattern that is perpendicular to the step-like part is transferred to the substrate, the intensity of the light shone onto the second region is calculated based on the ratio of the surface area of the shape of the light source of the projection lens as viewed from the second region to the surface area of the shape of said light source as viewed from the first region.

16. The method of substrate topography correction of claim 15, wherein calculating the intensity of the light shone onto the second region is carried out based on an eclipsed shape of an exit pupil of said projection lens blocked by the step-like part.

17. The method of substrate topography correction of claim 15, wherein the ratio of the surface area of the light source shape as viewed from the second region to the surface area of the light source shape as viewed from the first region is determined by the height of the step-like part and the distance from a vertical line dropped from the apex of the step-like part.

18. The method of substrate topography correction of claim 13, wherein when a substance that transmits the light is disposed on the substrate, the aperture angle is set using Snell's law and the refractive index of the substance.

* * * * *